US006780701B2

(12) United States Patent
Kanda et al.

(10) Patent No.: US 6,780,701 B2
(45) Date of Patent: Aug. 24, 2004

(54) METHOD FOR MANUFACTURING HIGH-BREAKDOWN VOLTAGE TRANSISTOR AND LOW-BREAKDOWN VOLTAGE TRANSISTOR ON THE SAME SUBSTRATE

(75) Inventors: Atsushi Kanda, Tokyo (JP); Yasushi Haga, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/268,760

(22) Filed: Oct. 11, 2002

(65) Prior Publication Data

US 2003/0080354 A1 May 1, 2003

(30) Foreign Application Priority Data

Oct. 18, 2001 (JP) ........................................ 2001-321062

(51) Int. Cl.[7] ........................................ H01L 21/8238
(52) U.S. Cl. ........................ 438/218; 438/218; 438/400
(58) Field of Search ................................ 438/218, 276, 438/302, 289, 303, 305, 217; 257/500

(56) References Cited

U.S. PATENT DOCUMENTS 5,188,976 A  *  2/1993  Kume et al. ................. 438/258
6,084,283 A  *  7/2000  Arai ........................... 257/500

FOREIGN PATENT DOCUMENTS

JP          A 1-99260          4/1989
JP          A 8-204021         8/1996

* cited by examiner

*Primary Examiner*—David Nelms
*Assistant Examiner*—Thinh T Nguyen
(74) *Attorney, Agent, or Firm*—Oliff & Berridge, PLC

(57) ABSTRACT

The present invention provides a technique for efficiently forming a high-breakdown voltage transistor and a low-breakdown voltage transistor on the same substrate while reducing the deterioration of each transistor's characteristics. At first, an insulating film is formed. The insulating film portions above the drain and source formation regions for the high-breakdown voltage transistor are thicker than those for the low-breakdown voltage transistor. Next, gates are formed on the insulating film. Then sidewalls are formed on the sides of the low-breakdown voltage transistor gate, and apertures are made in the insulating film portions above the drain and source formation regions for each transistor. When apertures are made in the relatively thick insulating film portions above the drain and source formation regions for the high-breakdown voltage transistor, etching is performed not to narrow widths of the sidewalls formed on the sides of the gate for the low-breakdown voltage transistor. Then drain and source regions are formed for each transistor by introduction of impure elements through the apertures.

11 Claims, 40 Drawing Sheets

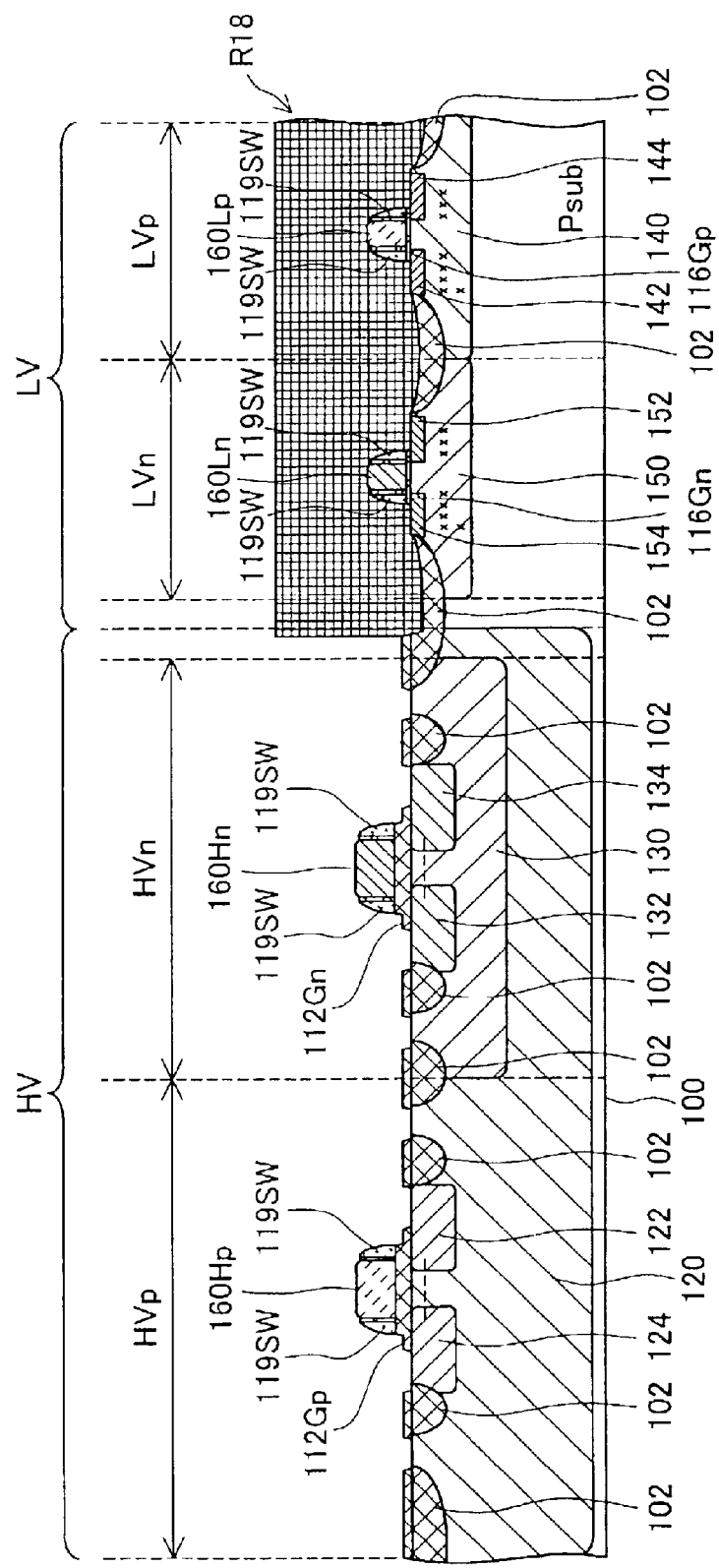

METHOD FOR MANUFACTURING HIGH-BREAKDOWN VOLTAGE TRANSISTOR AND LOW-BREAKDOWN VOLTAGE TRANSISTOR ON THE SAME SUBSTRATE

BACKGROUND OF THE INVENTION

1. Field of the Invention

The invention relates to the technique for forming a high-breakdown voltage transistor and a low-breakdown voltage transistor on the same substrate.

2. Description of the Related Art

Driver devices for driving photo devices, liquid crystal displays (LCDs), print heads, and the like are provided with a drive section and a logic section for controlling the drive section. Ordinarily, the drive section includes a high-breakdown voltage transistor with relatively high drain-source breakdown voltage (also called "drain breakdown voltage"), and the logic section contains a low-breakdown voltage transistor with relatively low drain breakdown voltage. The high-breakdown voltage transistor, for example, operates at a supply voltage of about 10 volts or higher, whereas the low-breakdown voltage transistor operates at a supply voltage of about 5 volts or lower.

It is desirable that the high-breakdown voltage transistor and the low-breakdown voltage transistor for the above-described driver device are formed on a single substrate. Conventionally, in order to efficiently form transistors with different breakdown voltages on the same substrate, part of the process for manufacturing each transistor is common to both, but in many cases the characteristics of at least one of the transistors are damaged accordingly.

SUMMARY OF THE INVENTION

The object of the present invention is thus to solve the drawbacks of the prior art discussed above and to provide a technique for efficiently forming a high-breakdown voltage transistor and a low-breakdown voltage transistor on the same substrate while reducing the deterioration of each transistor's characteristics.

At least part of the above and the other related objects is attained by a method for manufacturing a semiconductor device of the present invention. In the semiconductor device, a high-breakdown voltage transistor and a low-breakdown voltage transistor of insulated-gate type, having different drain-source breakdown voltages, are present on the same semiconductor substrate, each transistor being formed in one of element formation regions of the substrate, each element formation region including a source formation region and a drain formation region. The manufacturing method comprises the steps of: (a) forming an insulating film containing portions to be used as gate insulating films within each of the element formation regions, the insulating film portions formed on the drain and source formation regions for the high-breakdown voltage transistor being thicker than those for the low-breakdown voltage transistor; (b) forming gates on the insulating films of the transistors; (c) forming sidewalls on the sides of the gate of at least the low-breakdown voltage transistor, and making apertures in the insulating film portions over the drain and source formation regions for the transistors by etching, wherein when the apertures are made in relatively thick insulating film portions on the drain and source formation regions for the high-breakdown voltage transistor, the etching is performed without narrowing widths of sidewalls formed on the sides of the gate of the low-breakdown voltage transistor; and (d) introducing impure elements into the drain and source formation regions for the transistors through the apertures made in the insulating film so as to form drain and source regions of the transistors.

In this method, when the apertures are made in the relatively thick insulating film portions on the drain and source forming regions for the high-breakdown voltage transistor, etching is performed not to narrow the widths of the sidewalls formed on the sides of the low-breakdown voltage transistor gate. This enables the drain-source distance on the low-breakdown voltage transistor to be kept relatively precise, which makes it possible to reduce the lowering of drain-source breakdown voltage (that is, drain breakdown voltage). In other words, using this method makes it possible to efficiently form the high-breakdown voltage transistor and the low-breakdown voltage transistor on the same substrate, and to reduce the deterioration of each transistor's characteristics.

In one preferable application, the step (c) may include: (c1) forming, on the element formation region for at least the low-breakdown voltage transistor, a material film composed of insulating material different from the insulating film; (c2) performing selective etching for etching the material film without etching the insulating film, so as to form the sidewalls on the sides of the gate of at least the low-breakdown voltage transistor; and (c3) performing selective etching for etching the insulating film without etching the material film, so as to make the apertures in the insulating film portions present above the drain and source formation regions for the transistors.

This arrangement makes it possible to selectively etch the material film and the insulating film, which in turn makes it possible to etch the insulating film portions on the drain and source formation regions for the high-breakdown voltage transistor in a way that does not cause the sidewalls formed on the sides of the low-breakdown voltage transistor gate to narrow.

In the above method, the semiconductor substrate may be a silicon substrate; the insulating film may be a silicon oxide film; and the material film may be a silicon nitride film.

In the above method, it is preferable that the step (b) includes forming the gates of the transistors of polysilicon; the step (c) includes forming a silicon oxide film on the sides of the gates formed of polysilicon prior to the formation of the sidewalls; and the step (d) includes introducing impure elements into the gates.

In this way, it is possible to form the transistor gate from polysilicon into which impure elements have been introduced rather than from metallic materials. Also, by using the above method, a silicon oxide film is formed between the gate composed of polysilicon and the sidewalls composed of silicon nitride. The interposition of the silicon oxide film makes it possible to relax the stress that arises due to the formation of the silicon nitride film, which in turn makes it possible to reduce the occurrence of pealing and cracking.

In another preferable application, the step (c) may include: (c1) forming, on the element formation region for at least the low-breakdown voltage transistor, a material film composed of the same material as the insulating film; (c2) etching the material film so as to form the sidewalls on the sides of the gate of at least the low-breakdown voltage transistor; and continuing the etching so as to make the apertures on the relatively thin insulating film portions present over the drain and source formation regions for the low-breakdown voltage transistor; (c3) forming a resist for protecting the element formation region for the low-breakdown voltage transistor; and (c4) further etching the insulating film so as to make the apertures on the relatively thick insulating film portions remaining over the drain and source formation regions for the high-breakdown voltage transistor.

In this arrangement, when the apertures are made in the relatively thick insulating film portions that remains above the drain and source formation regions for the high-breakdown voltage transistor, the sidewalls formed on the sides of the low-breakdown voltage transistor gate will not be etched. This makes it possible to etch the insulating film portions on the drain and source formation regions for the high-breakdown voltage transistor without narrowing the width of the sidewalls.

In the above method, the semiconductor substrate may be a silicon substrate; and the insulating film and the material film may be silicon oxide films.

In the above method, it is preferable that the semiconductor substrate is a silicon substrate; the insulating film is a silicon oxide film; the step (b) includes forming the gates of the transistors of polysilicon; and the step (d) includes introducing impure elements into the gates.

In this way, it is possible to form the transistor gate from polysilicon into which impure elements have been introduced rather than from metallic materials.

In the above method, the step (b) may include forming the gate of the high-breakdown voltage transistor over a center portion of the gate insulating film; and the step (d) may include the steps of: providing a resist above a peripheral portion of the gate insulating film of at least the high-breakdown voltage transistor; and introducing the impure elements into the drain and source formation regions for the transistors by ion implantation.

When making the apertures in the relatively thick insulating film portions above the drain and source formation regions for the high-breakdown voltage transistor, the periphery of the high-breakdown voltage transistor gate insulating film will become relatively thin. If the periphery of the high-breakdown voltage transistor gate insulating film is thin, impurities will sometimes be implanted into the lower layer regions of the gate insulating film periphery. In such cases, the distance between the drain and source regions will decrease, resulting in lower drain breakdown voltage. But the above arrangement makes it possible to suppress the implantation of impurities into the lower layer regions of the high-breakdown voltage transistor gate insulating film, which in turn makes it possible to reduce the lowering of drain breakdown voltage.

In the above method, the step (b) may include forming the gate of the high-breakdown voltage transistor over a center portion of the gate insulating film; and the method may further comprise the steps of: (e) providing a protective film above a peripheral portion of the gate insulating film of at least the high-breakdown voltage transistor; and (f) forming a metallic layer over at least the drain and source regions of the transistors, and causing the metallic layer to compound with surface layers of the drain and source regions, so as to form contact layers for connecting to metal wires.

When making the apertures in the relatively thick insulating film portions above the drain and source formation regions for the high-breakdown voltage transistor, the periphery of the high-breakdown voltage transistor gate insulating film will become relatively thin. If the periphery of the high-breakdown voltage transistor gate insulating film is thin, the metallic layer will compound with the lower layer regions of the gate insulating film periphery. In such cases, the distance between contact layers of the drain region and the source region will decrease, resulting in lower drain breakdown voltage. But the above arrangement makes it possible to suppress the compounding of the metallic layer with the lower layer regions of the gate insulating film of the high-breakdown voltage transistor, which in turn makes it possible to reduce the lowering of drain breakdown voltage.

In the above method, the semiconductor substrate may be a silicon substrate; the insulating film may be a silicon oxide film; the step (b) may include forming the gates of the transistors of polysilicon; the step (d) may include introducing impure elements into the gates; and the step (f) may include forming the metallic layer over the gates of the transistors, and causing the metallic layer to compound with the surface layers of the gates, so as to form the contact layers.

As described above, when the gate is composed of polysilicon, it is preferable that a contact layer is formed on the gate surface. The compound of silicon and metal is called a silicide.

The present invention is also directed to a semiconductor device, which comprises: a semiconductor substrate; and a high-breakdown voltage transistor and a low-breakdown voltage transistor of insulated-gate type, having different drain-source breakdown voltages, formed on the semiconductor substrate. The low-breakdown voltage transistor comprises: a first gate insulating film; a first gate formed over the first gate insulating film; and first sidewalls formed on the sides of the first gate and composed of different material from the first gate insulating film.

When the invented method is employed, a semiconductor device have the characteristics described above is manufactured.

These and other objects, features, aspects, and advantages of the present invention will become more apparent from the following detailed description of the preferred embodiments with the accompanying drawings.

BRIEF DESCRIPTION OF THE DRAWINGS

FIG. 40 is a simplified cross-section showing the situation when the second round of etching in the sidewall formation process of the Second Embodiment has been completed.

DESCRIPTION OF THE PREFERRED EMBODIMENT

The mode for carrying out the present invention is discussed in the following order, as preferred embodiments.
A. Comparative example:
A-1. Manufacturing method of comparative example:
A-2. Characteristics of semiconductor device made according to manufacturing method of comparative example:
B. First Embodiment:
C. Second Embodiment:

A. Comparative Example
A-1. Manufacturing Method of Comparative Example:

Prior to the explanation for the invented method for manufacturing the semiconductor device, a manufacturing method of a comparative example will be explained. In the comparative example, a high-breakdown voltage transistor and a low-breakdown voltage transistor, each having a MOS (metal oxide semiconductor) structure, are formed on the same semiconductor substrate. The gates of each transistor are formed of polysilicon, but normally this structure is also called a MOS structure.

Figure 1:
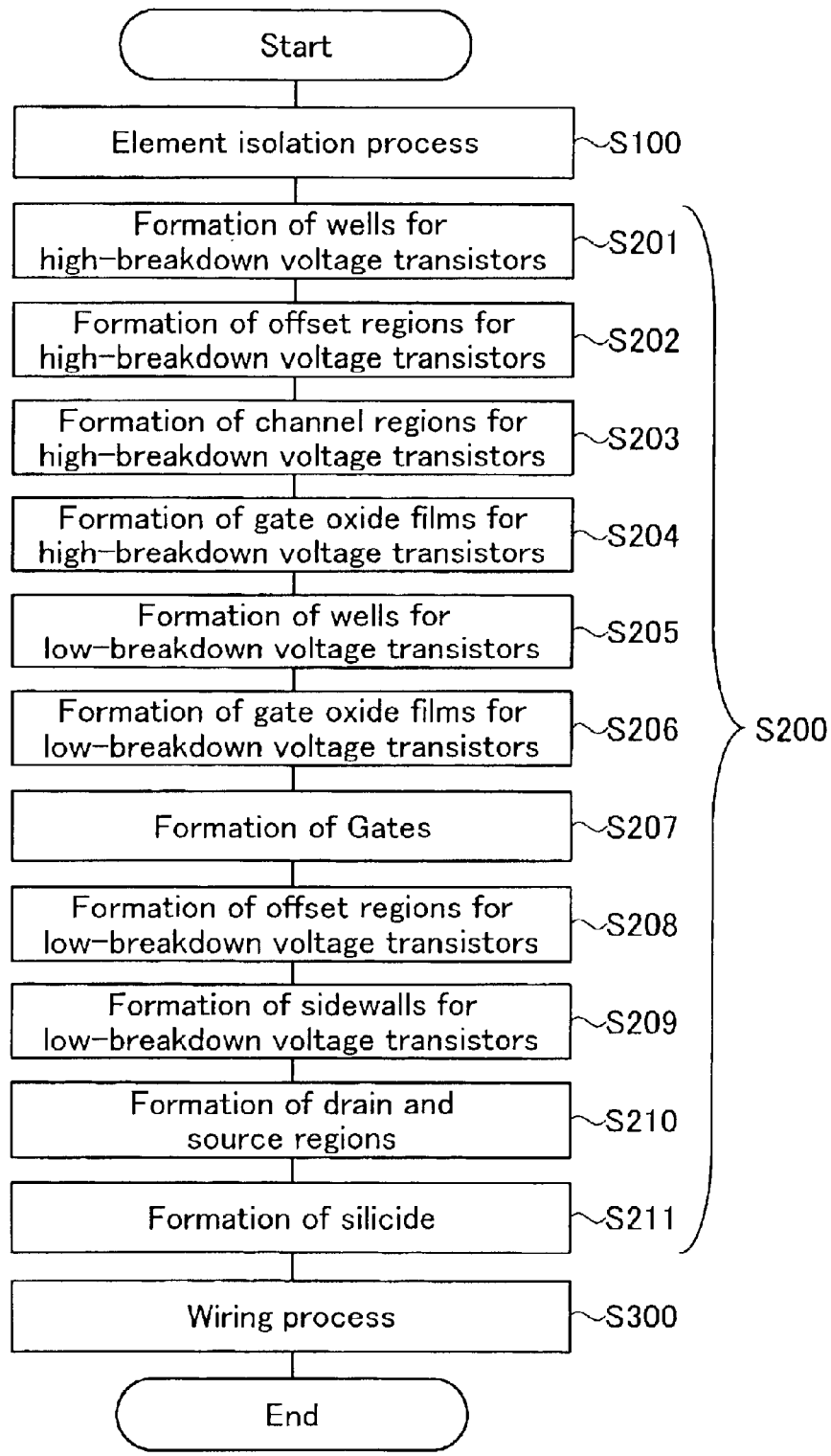
FIG. 1 is a flowchart for a semiconductor device manufacturing process.

FIG. 1 is a flowchart for a semiconductor device manufacturing process. Steps S100, S200, and S300 represent respectively the element isolation process, the element formation process, and the wiring process.

Figure 2:
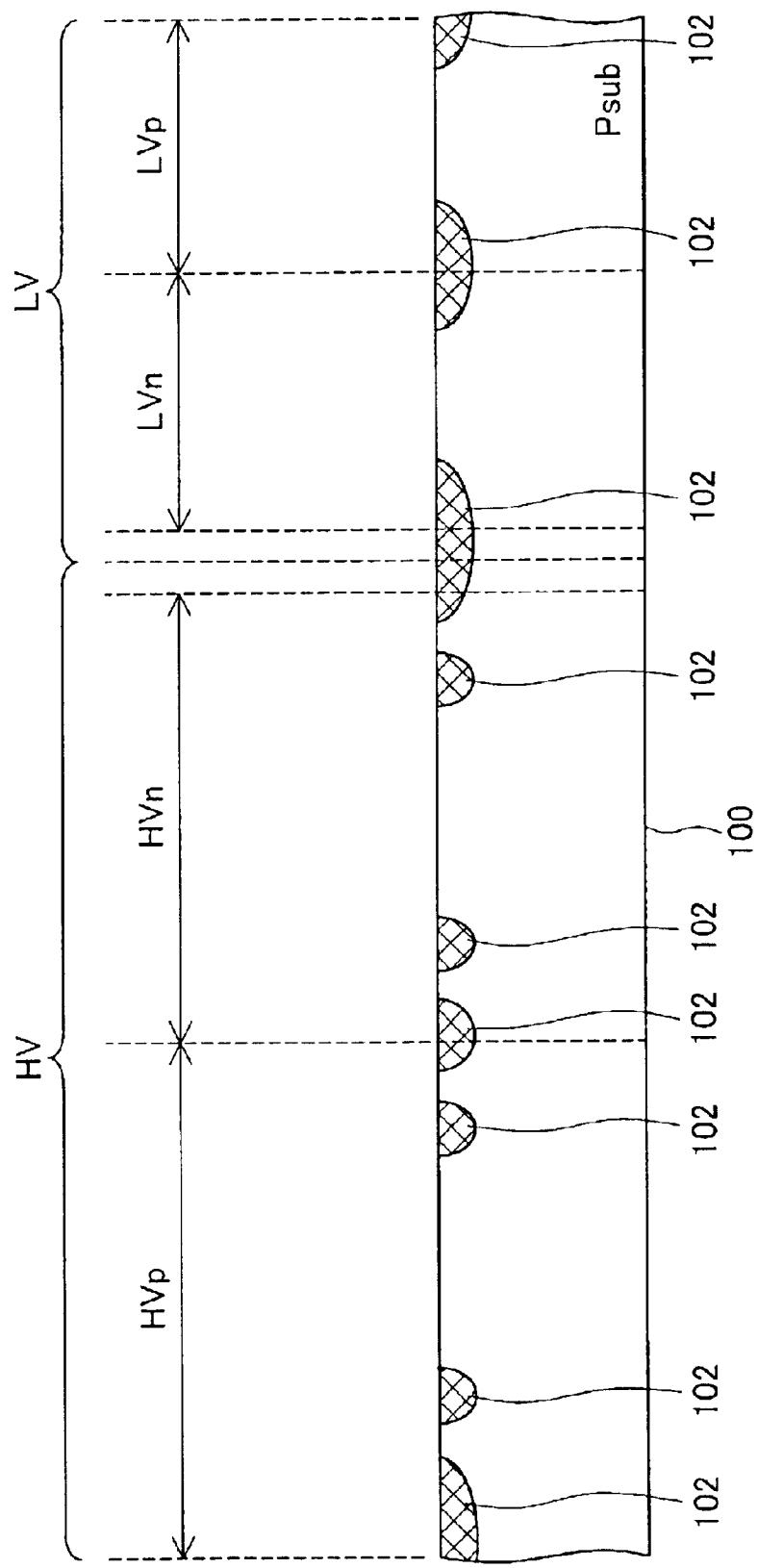
FIG. 2 is a simplified cross-section showing a semiconductor substrate on which an element isolation region has been formed.

In Step S100 (FIG. 1) for the element isolation process, an element isolation region (also called the "field section" or the "isolation section") is formed on the semiconductor substrate in order to isolate the elements. FIG. 2 is a simplified cross-section showing a semiconductor substrate on which an element isolation region has been formed. The semiconductor substrate 100 is a p-type silicon substrate. A field oxide film 102 is formed as the element isolation region on substrate 100 by the LOCOS method.

In the figure, the region HV indicates the high-breakdown voltage transistor formation region where a high-breakdown voltage transistor is to be formed, and the region LV indicates the low-breakdown voltage transistor formation region where a low-breakdown voltage transistor is to be formed. The region HVp indicates the high-breakdown voltage p-channel MOS (pMOS) transistor formation region, and the region HVn indicates the high-breakdown voltage n-channel MOS (nMOS) transistor formation region. Similarly, the region LVp indicates the low-breakdown voltage pMOS transistor formation region, and the region LVn indicates the low-breakdown voltage nMOS transistor formation region.

In Step S200 (FIG. 1) for the element formation process, the transistors are formed in each element formation region that has been isolated by the element isolation regions. FIGS. 2 through 29 show the series of steps in the element formation process.

In Step S201 (FIG. 1), wells for the high-breakdown voltage transistors are formed. Specifically, in the HV region an n-type well (n-well) is formed for the formation of the high-breakdown voltage pMOS transistor, and in the HVn region a p-type well (p-well) is formed for the formation of the high-breakdown voltage nMOS transistor.

Figure 3:
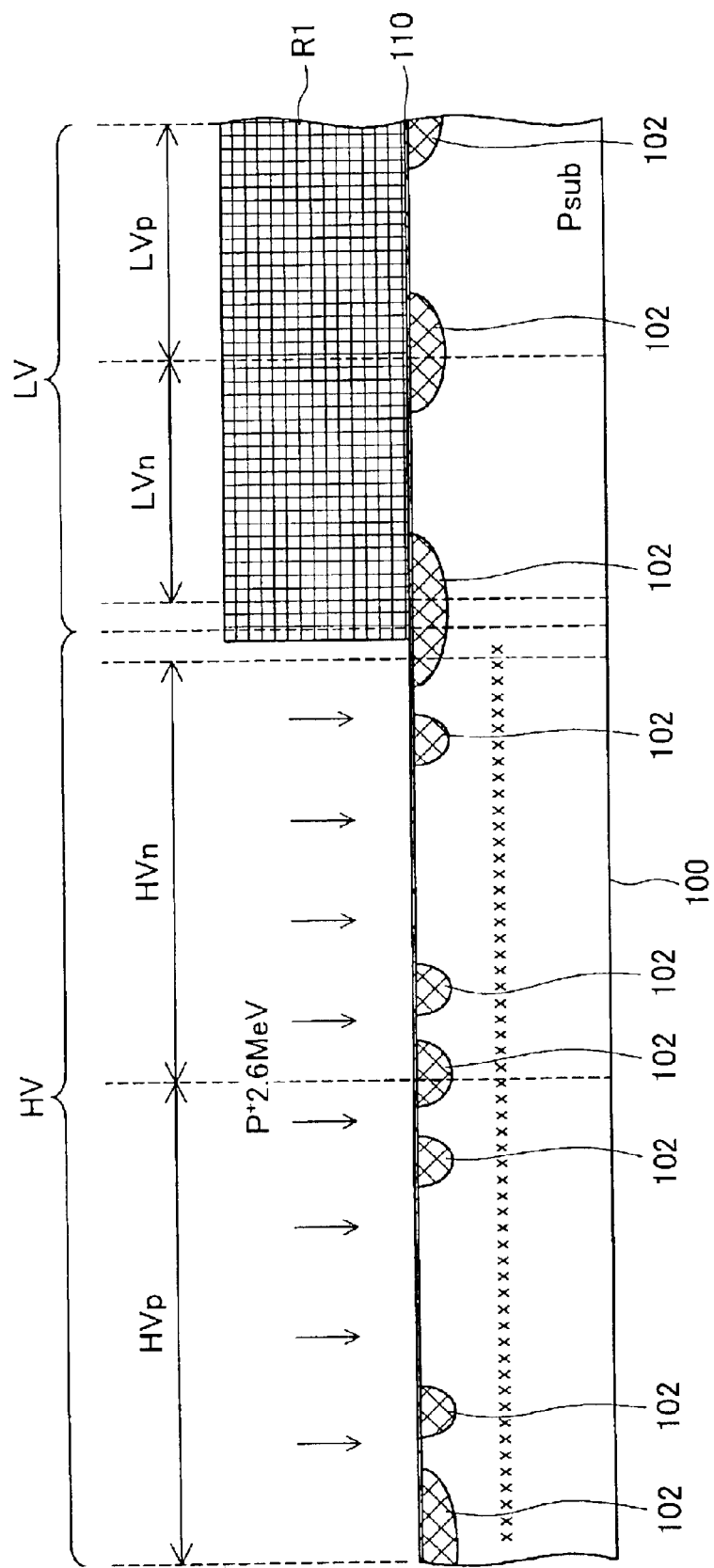
FIGS. 3 and 4 are simplified cross-sections showing the process for forming the n-well for the high-breakdown voltage pMOS transistor.
Figure 4:
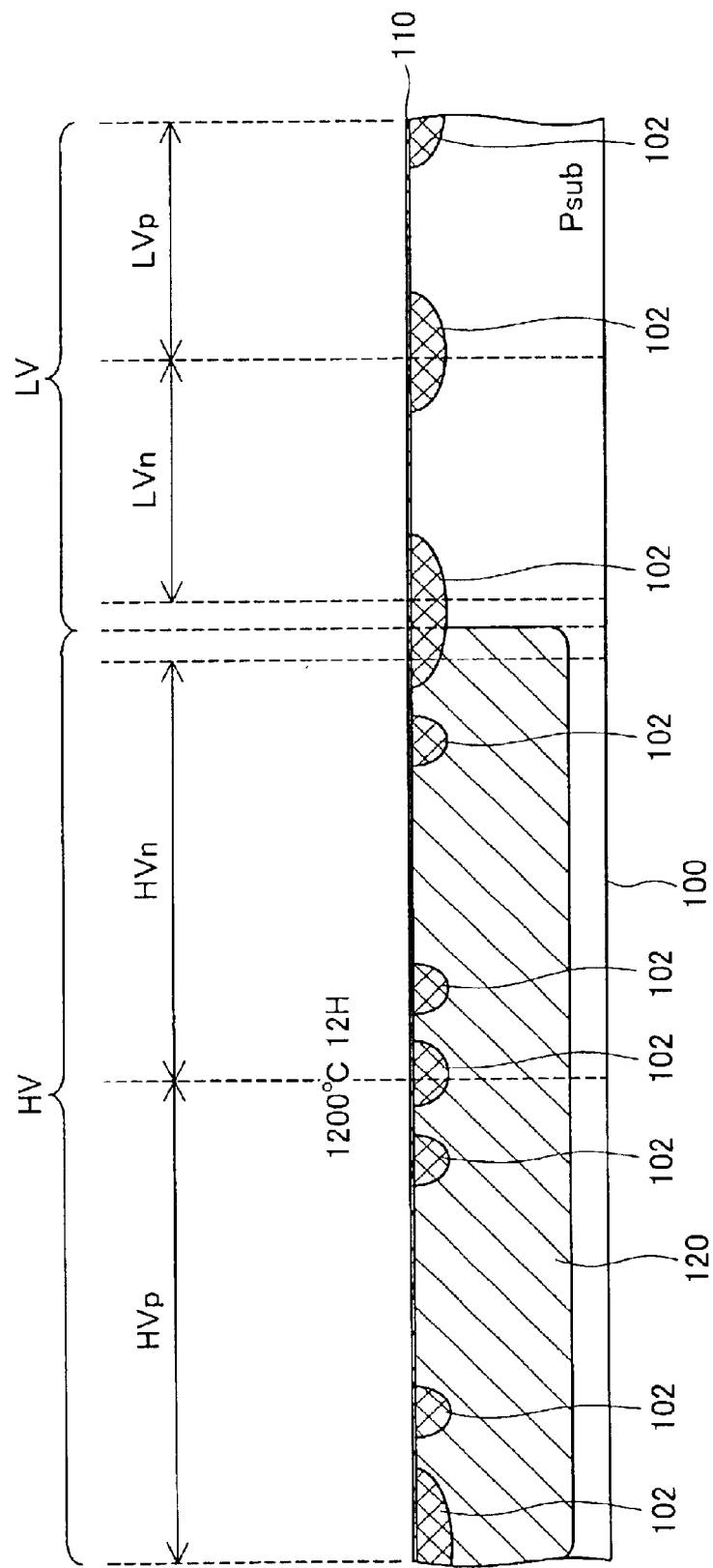
Figure 5:
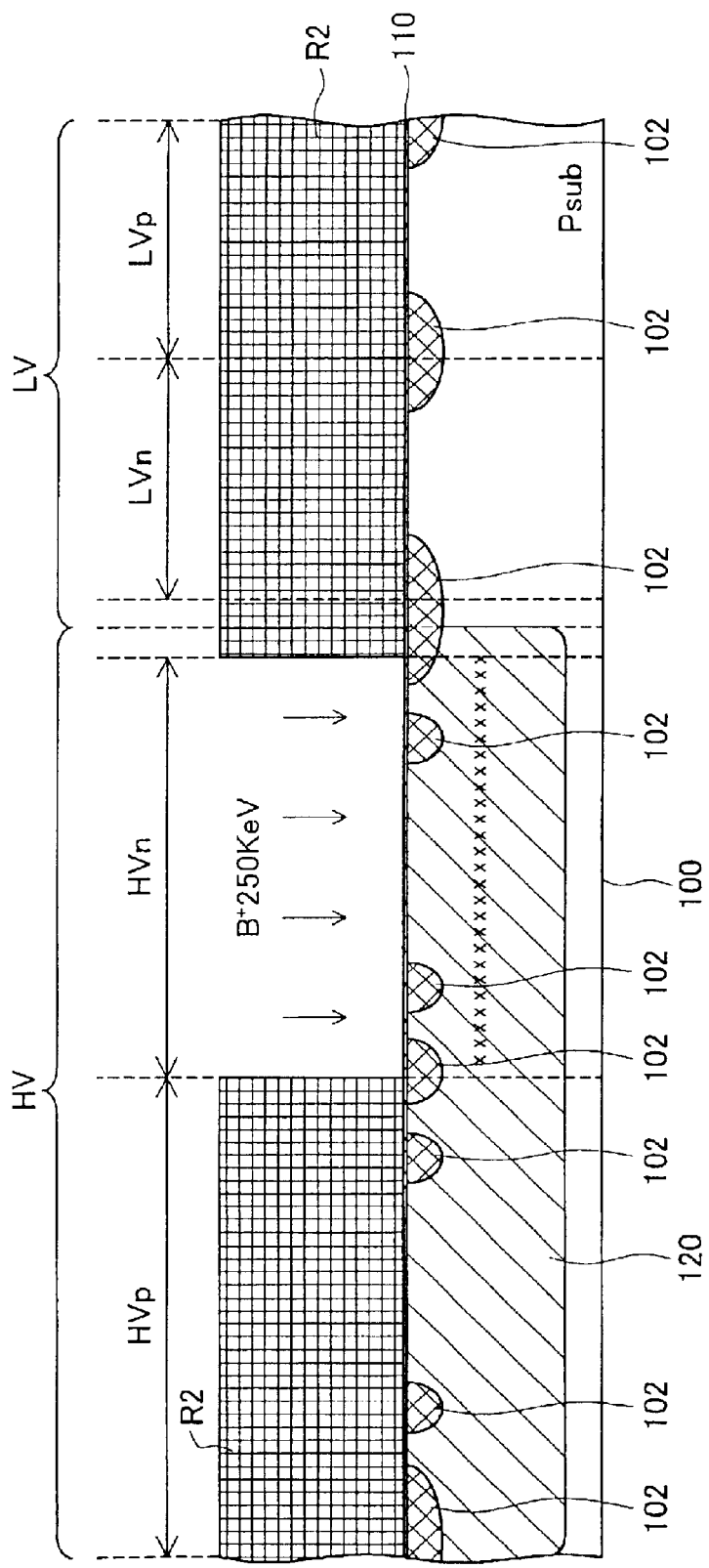
FIGS. 5 and 6 are simplified cross-sections showing the process for forming the p-well for the high-breakdown voltage nMOS transistor.
Figure 6:
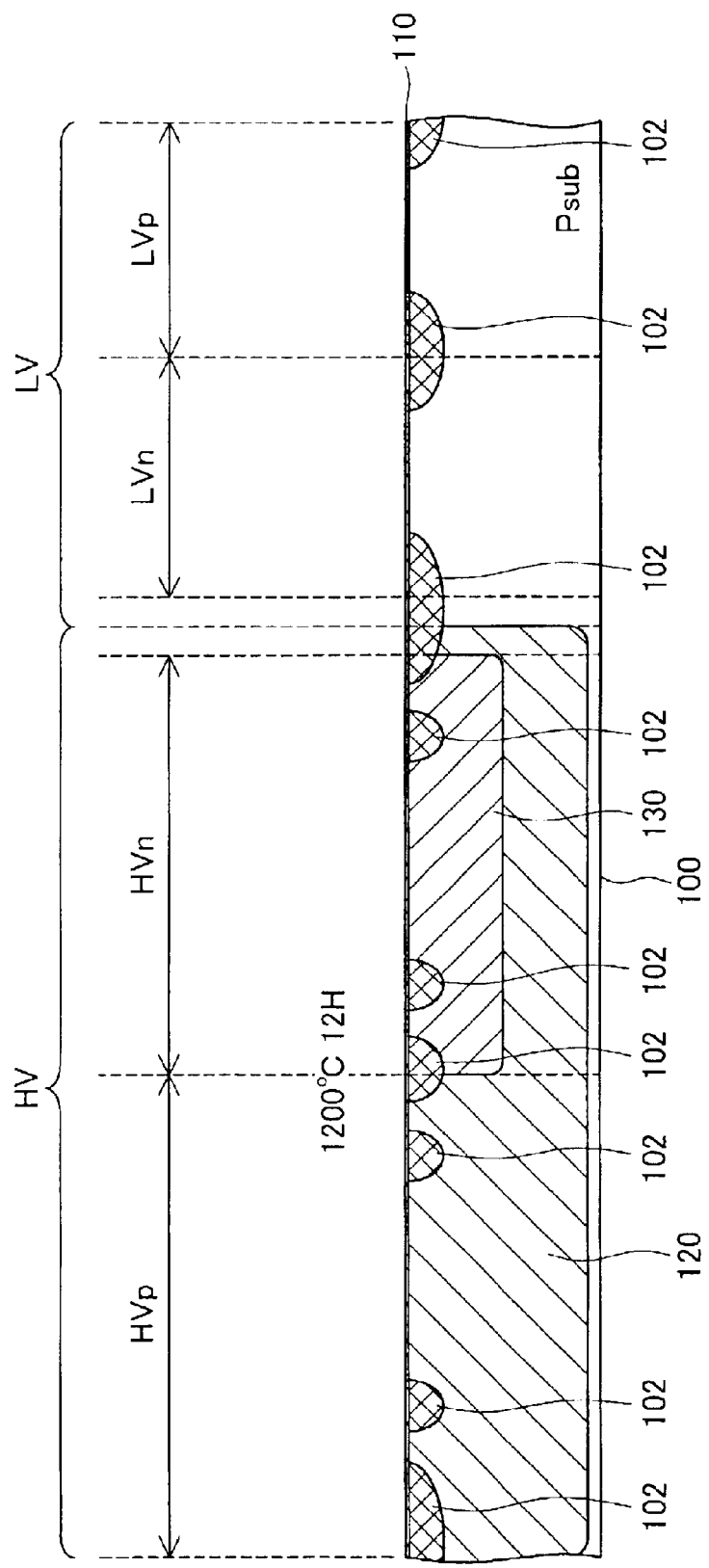

FIGS. 3 and 4 are simplified cross-sections showing the process for forming the n-well for the high-breakdown voltage pMOS transistor. FIGS. 5 and 6 are simplified cross-sections showing the process for forming the p-well for the high-breakdown voltage nMOS transistor.

In FIG. 3, the first oxide film ($SiO_2$ film) 110 is formed over the entire surface of substrate 100 by thermal oxidation. The oxide film 110 is formed in order to reduce the damage that may occur to the substrate within region HV during subsequent processing. Then the first resist R1 is formed by photolithography. The resist R1 has an aperture in region HV. Then n-type impurities are introduced into substrate 100 by ion implantation through the aperture in first resist R1. In this case, phosphorous ions ($P^+$) having about 2.6 MeV of energy are implanted. The implanted impurities are indicated by "x" symbols in the figure. In FIG. 4, first resist R1 is removed and then a heat treatment is performed at about 1200 degrees C. for about 12 hours, which causes the n-type impurities (phosphorus) to be dispersed into substrate 100, thus forming n-well 120.

In FIG. 5, the second resist R2 is formed. The resist R2 has an aperture in region HVn. Then p-type impurities are introduced into substrate 100 by ion implantation through the aperture in second resist R2. In this case, boron ions (B⁺) having about 250 keV of energy are implanted. In FIG. 6, second resist R2 is removed and then a heat treatment is performed at about 1200 degrees C. for about 12 hours, which causes the p-type impurities (boron) to be dispersed into n-well 120, thus forming p-well 130 within n-well 120.

Figure 7:
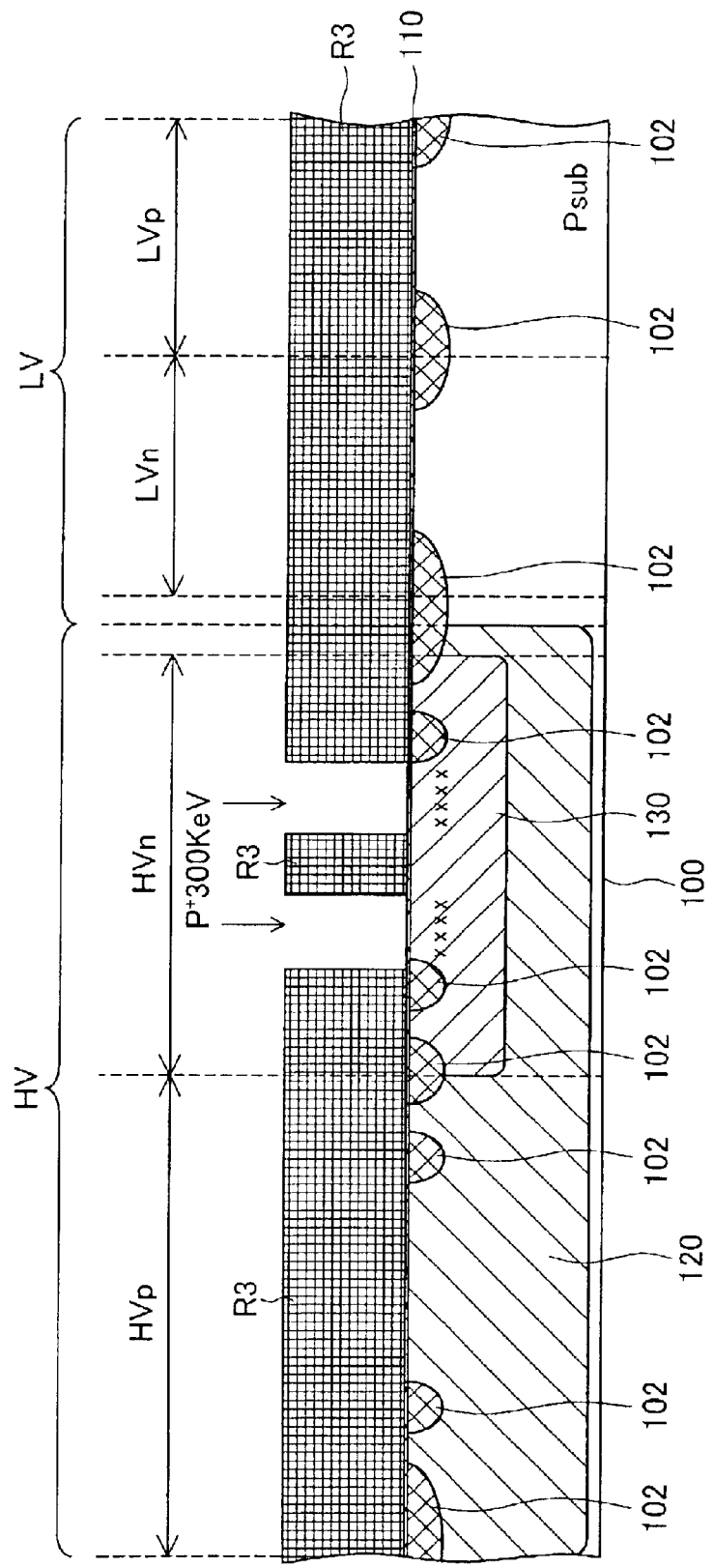
FIGS. 7, 8, and 9 are simplified cross-sections showing the process for forming the drain and source offset regions for the high-breakdown voltage transistors.
Figure 8:
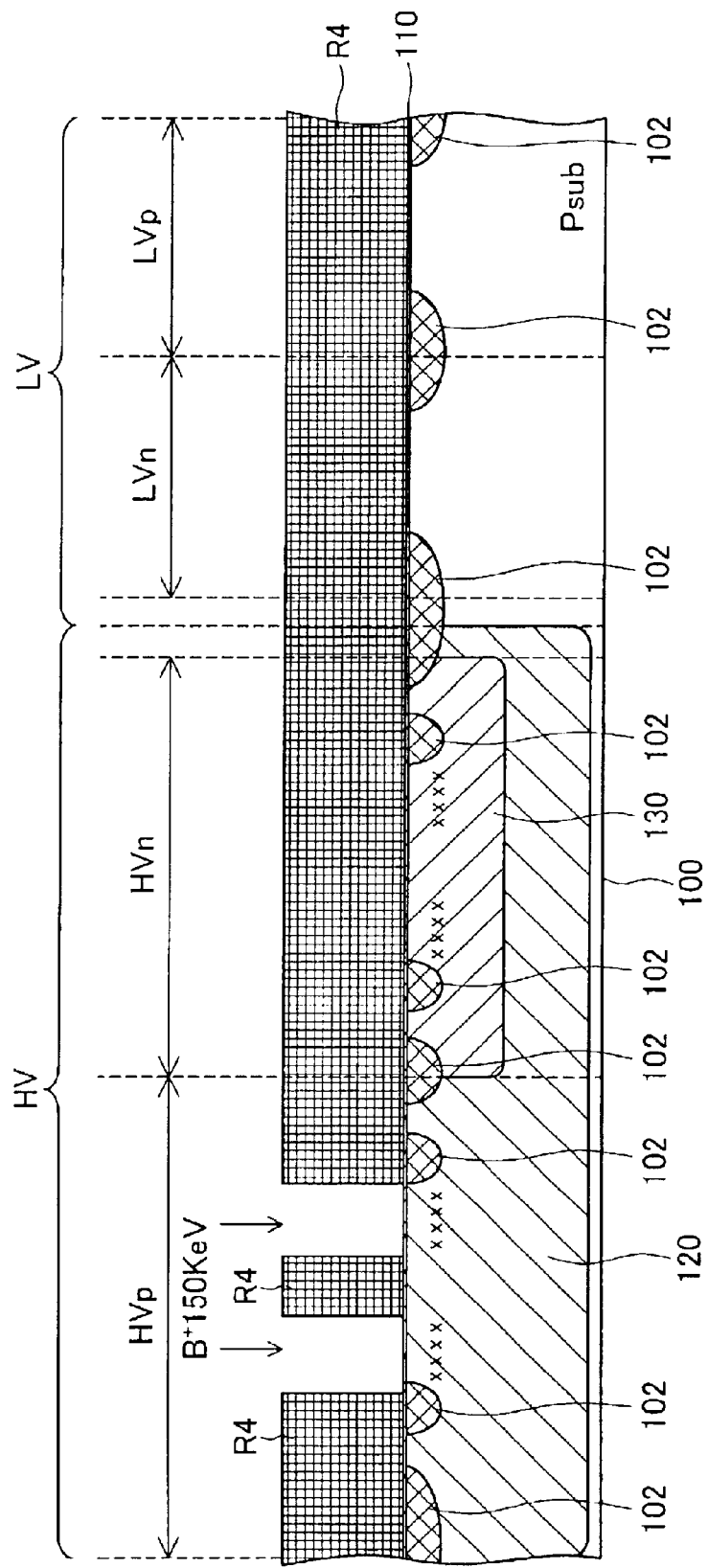
Figure 9:
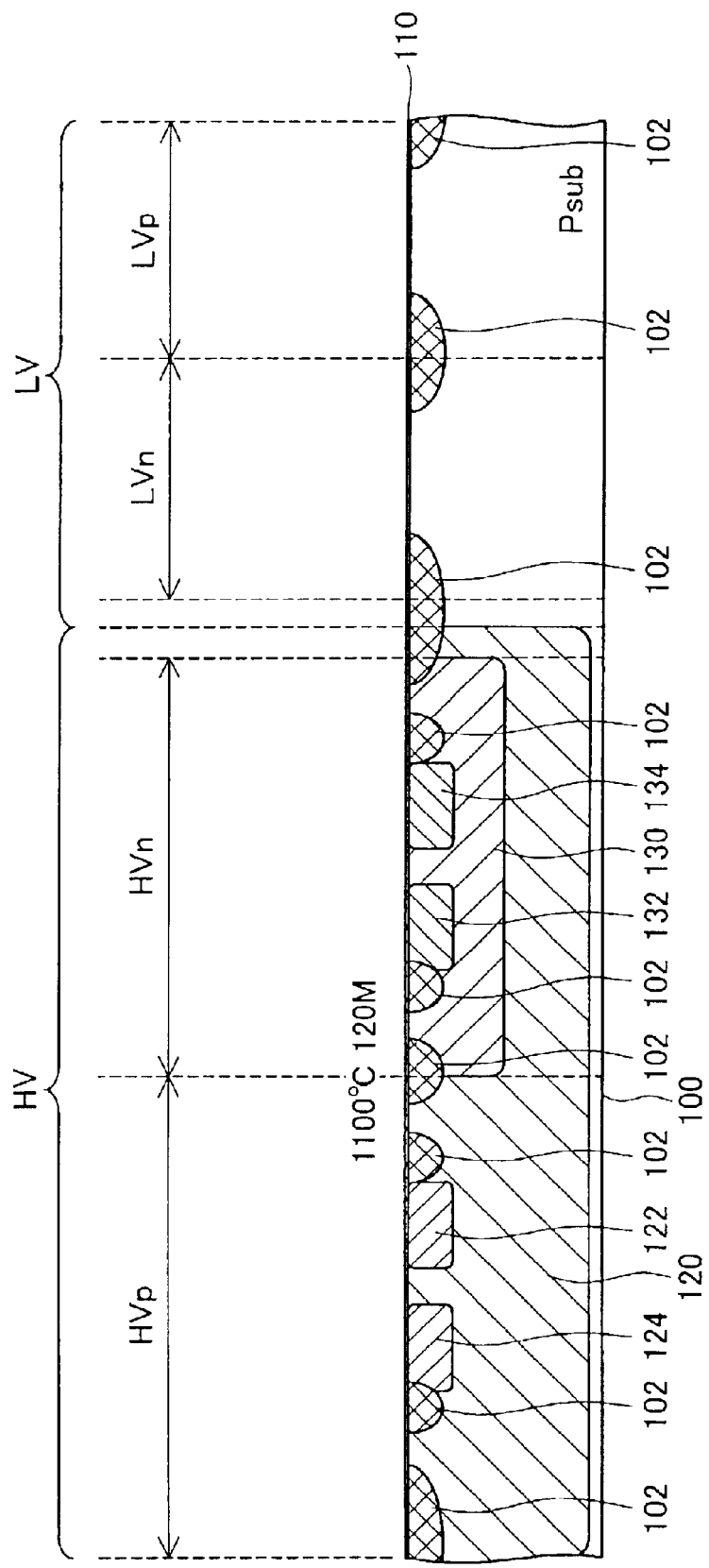

In Step S202 (FIG. 1), the drain and source offset regions for high-breakdown voltage transistors are formed. FIGS. 7, 8, and 9 are simplified cross-sections showing the process for forming the drain and source offset regions for the high-breakdown voltage transistors.

In FIG. 7, the third resist R3 is formed. The resist R3 has apertures on the drain and source offset formation regions of the high-breakdown voltage nMOS transistor. Then n-type impurities are introduced into substrate 100 by ion implantation through the apertures in third resist R3. In this case, phosphorus ions (P⁺) having about 300 keV of energy are implanted. After ion implantation, third resist R3 is removed. In FIG. 8 the fourth resist R4 is formed. The resist R4 has apertures on the drain and source offset formation regions of the high-breakdown voltage pMOS transistor. Then p-type impurities are introduced into substrate 100 by ion implantation through the apertures in fourth resist R4. In this case, boron ions (B⁺) having about 150 keV of energy are implanted. After ion implantation, fourth resist R4 is removed. Note that the order of the ion implantation processes shown in FIGS. 7 and 8 can be reversed.

In FIG. 9, a heat treatment is performed at about 1100 degrees C. for about 120 minutes, which causes the n-type impurities (phosphorous) implanted in FIG. 7 to be dispersed into p-well 130, resulting in the formation of drain offset region 132 and source offset region 134 for the high-breakdown voltage nMOS transistor. Also, the p-type impurities (boron) implanted in FIG. 8 is dispersed into n-well 120, resulting in the formation of drain offset region 122 and source offset region 124 for the high-breakdown voltage pMOS transistor.

Figure 10:
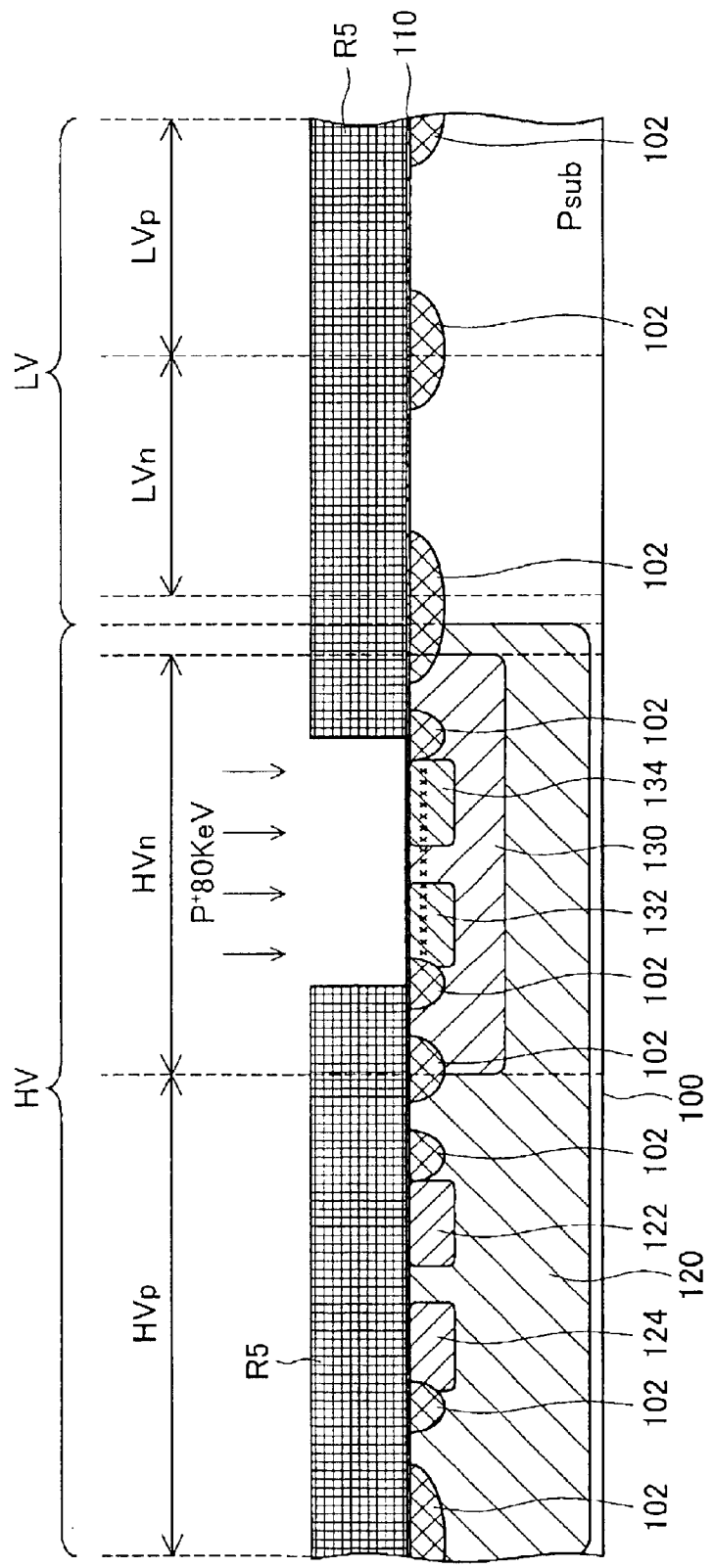
FIGS. 10 and 11 are simplified cross-sections showing the process for forming the channel regions of the high-breakdown voltage transistors.
Figure 11:
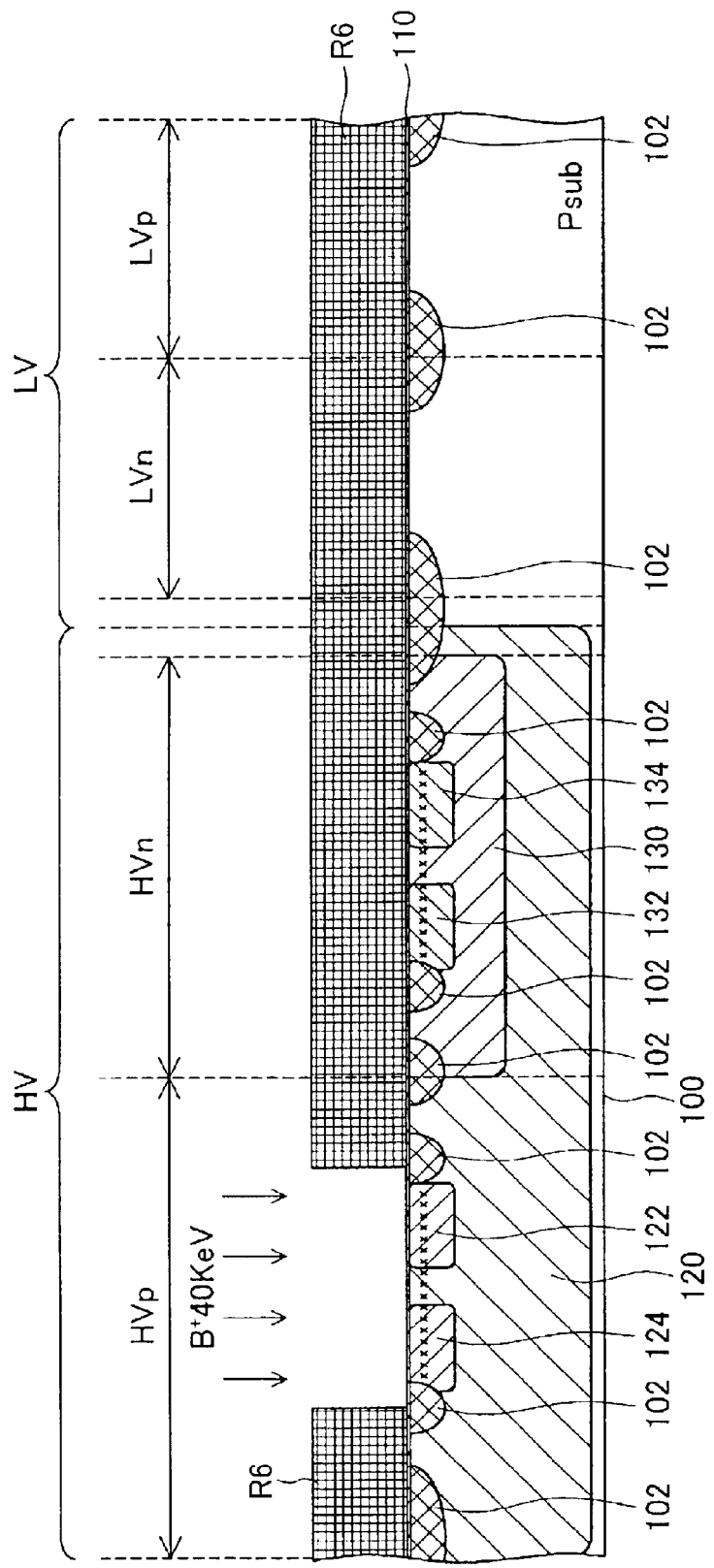

In Step S203 (FIG. 1), the channel regions of the high-breakdown voltage transistors are formed. Specifically, impurities are implanted into the channel region in order to adjust the threshold voltage of the high-breakdown voltage transistor. FIGS. 10 and 11 are simplified cross-sections showing the process for forming the channel regions of the high-breakdown voltage transistors.

In FIG. 10, the fifth resist R5 is formed. The resist R5 has an aperture in region HVn. Then n-type impurities are introduced into substrate 100 by ion implantation through the aperture in fifth resist R5. In this case, phosphorus ions (P⁺) having about 80 keV of energy are implanted. This implantation of n-type impurities into the channel region of the high-breakdown voltage nMOS transistor permits the threshold voltage to be adjusted. After ion implantation, fifth resist R5 is removed. In FIG. 11, the sixth resist R6 is formed. The resist R6 has an aperture in region HVp. Then p-type impurities are introduced into substrate 100 by ion implantation through the aperture in sixth resist R6. In this case, boron ions (B⁺) having about 40 keV of energy are implanted. This implantation of p-type impurities into the channel region of the high-breakdown voltage pMOS transistor permits the threshold voltage to be adjusted. After ion implantation, sixth resist R6 is removed. Note that the order of the ion implantation processes shown in FIGS. 10 and 11 can be reversed.

Figure 12:
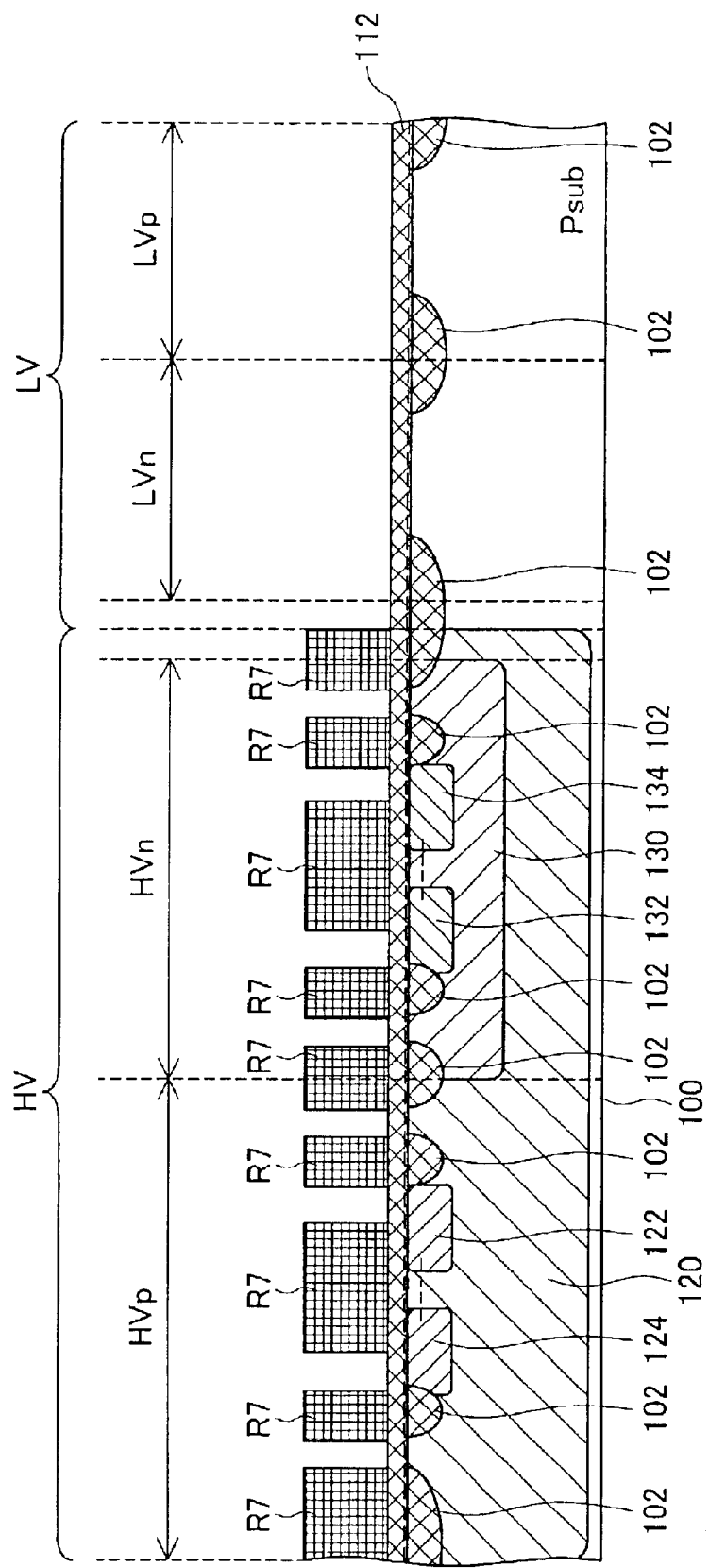
FIGS. 12 and 13 are simplified cross-sections showing the process for forming the gate oxide films.
Figure 13:
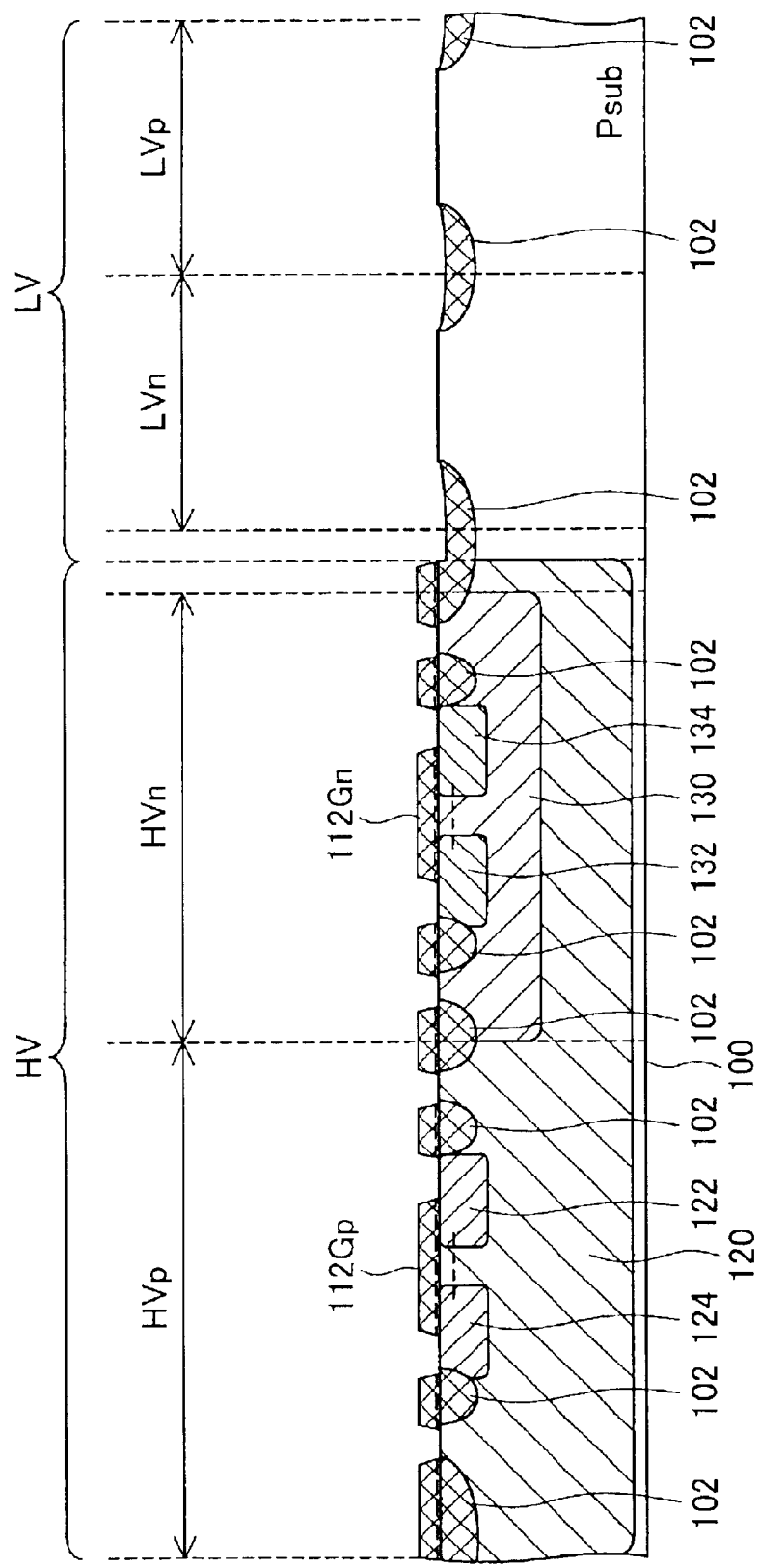

In Step S204 gate oxide films for the high-breakdown voltage transistors are formed. FIGS. 12 and 13 are simplified cross-sections showing the process for forming the gate oxide films.

In FIG. 12, the first oxide film 110 is removed by etching, and then a second oxide film 112 is formed over the entire surface of substrate 100 by thermal oxidation. The second oxide film 112 is thicker than the first oxide film 110. The seventh resist R7 is then formed in order to protect the areas to be used as the gate oxide films for the high-breakdown voltage transistors. The unnecessary portions of second oxide film 112 exposed to the apertures of seventh resist R7 are removed by etching. This results in the formation of a gate oxide film 112Gn for the high-breakdown voltage nMOS transistor and a gate oxide film 112Gp for the high-breakdown voltage pMOS transistor, as shown in FIG. 13. At this time, the thickness of gate oxide films 112Gn, 112Gp are about 700 Angstroms, but the final thickness of the gate oxide films to be greater than this, due to the subsequent processes.

Note that FIGS. 12 and 13 use broken lines to show the channel regions of the high-breakdown voltage transistors, in which impurities are implanted in FIGS. 10 and 11.

In Step S205 (FIG. 1), wells for the low-breakdown voltage transistors are formed. Specifically, in the LVp region an n-well is formed for the formation of the low-breakdown voltage pMOS transistor, and in the LVn region a p-well is formed for the formation of the low-breakdown voltage nMOS transistor.

Figure 14:
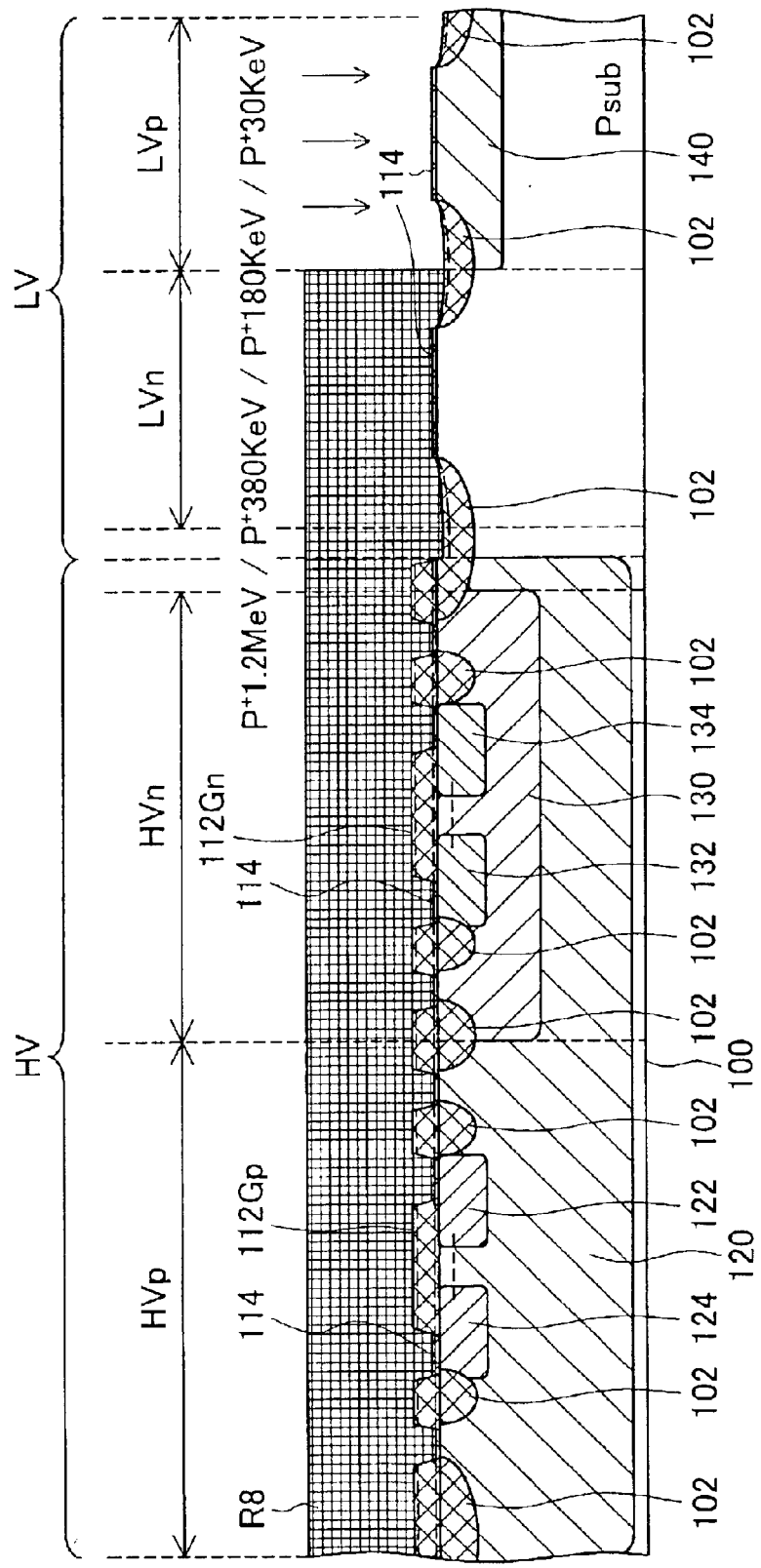
FIG. 14 is a simplified cross-section showing the process for forming the n-well for the low-breakdown voltage pMOS transistor.
Figure 15:
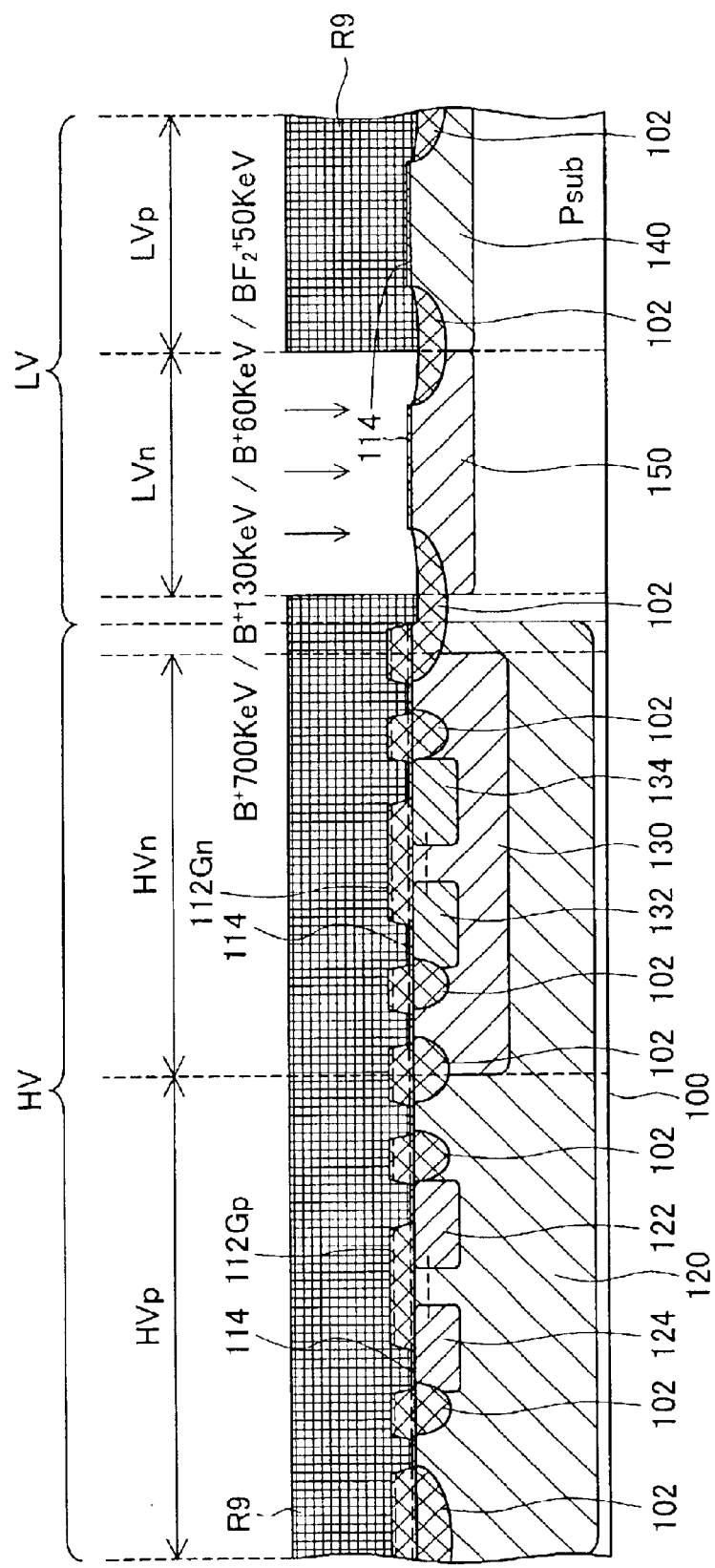
FIG. 15 is a simplified cross-section showing the process for forming the p-well for the low-breakdown voltage nMOS transistor.

FIG. 14 is a simplified cross-section showing the process for forming the n-well for the low-breakdown voltage pMOS transistor. FIG. 15 is a simplified cross-section showing the process for forming the p-well for the low-breakdown voltage nMOS transistor.

In FIG. 14, an oxide film is formed over the entire surface of substrate 100 by thermal oxidation. Specifically, the third oxide film 114 is formed in the low-breakdown voltage transistor formation region LV and the offset regions 122, 124, 132, 134 of the high-breakdown voltage transistor. At this time, the thickness of the high-breakdown voltage transistor gate oxide films 112Gn, 112Gp will increase. As a result, the thickness of third oxide film 114 is about 100 angstroms, and the thickness of gate oxide films 112Gn, 112Gp increase to about 760–770 Angstroms. The third oxide film 114 is formed in order to reduce the damage that may occur to the substrate within region LV during subsequent processing.

Then the eighth resist R8 is formed. The resist R8 has an aperture in region LVp. Then n-type impurities are introduced into substrate 100 by ion implantation through the aperture in eighth resist R8. In this case, phosphorous ions (P⁺) having four different energies of about 1.2 MeV, 380 keV, 180 keV, 30 keV are implanted. This result in formation of n-well 140. After ion implantation, eighth resist R8 is removed.

In FIG. 15, the ninth resist R9 is formed. The resist R9 has an aperture it region LVn. Then p-type impurities are introduced into substrate 100 by ion implantation through the aperture in ninth resist R9. In this case, boron ions (B⁺) having three different energies of about 700 keV, 130 keV, 60 keV are implanted, and also boron fluoride ions (BF₂⁺) having energy of about 50 keV are implanted. This results in formation of p-well 150. After ion implantation, ninth resist R9 is removed.

Note that the order for the well formation processes shown in FIGS. 14 and 15 can be reversed.

Figure 16:
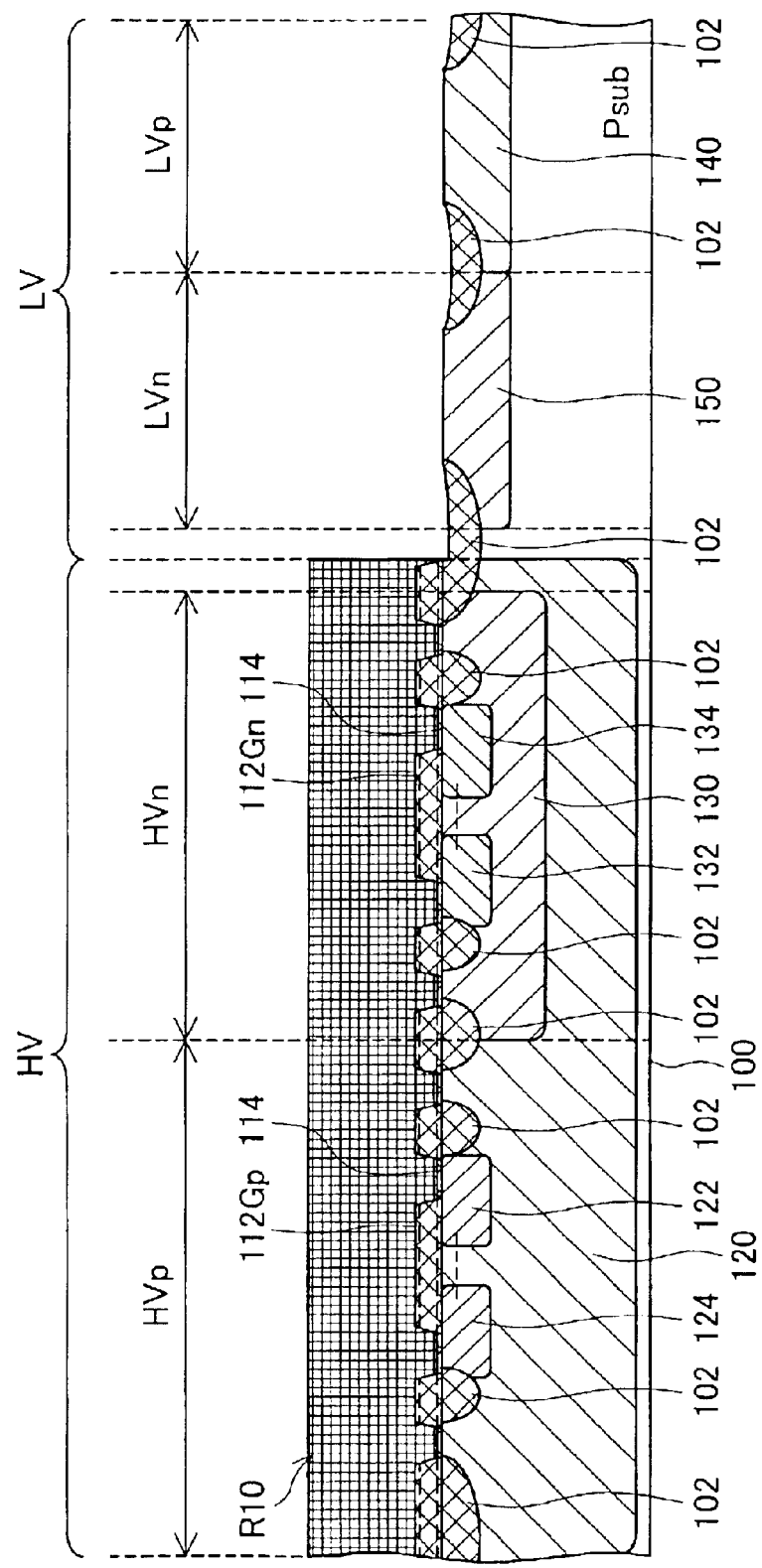
FIGS. 16 and 17 are simplified cross-sections showing the process for forming the gate oxide films for the low-breakdown voltage transistors.
Figure 17:
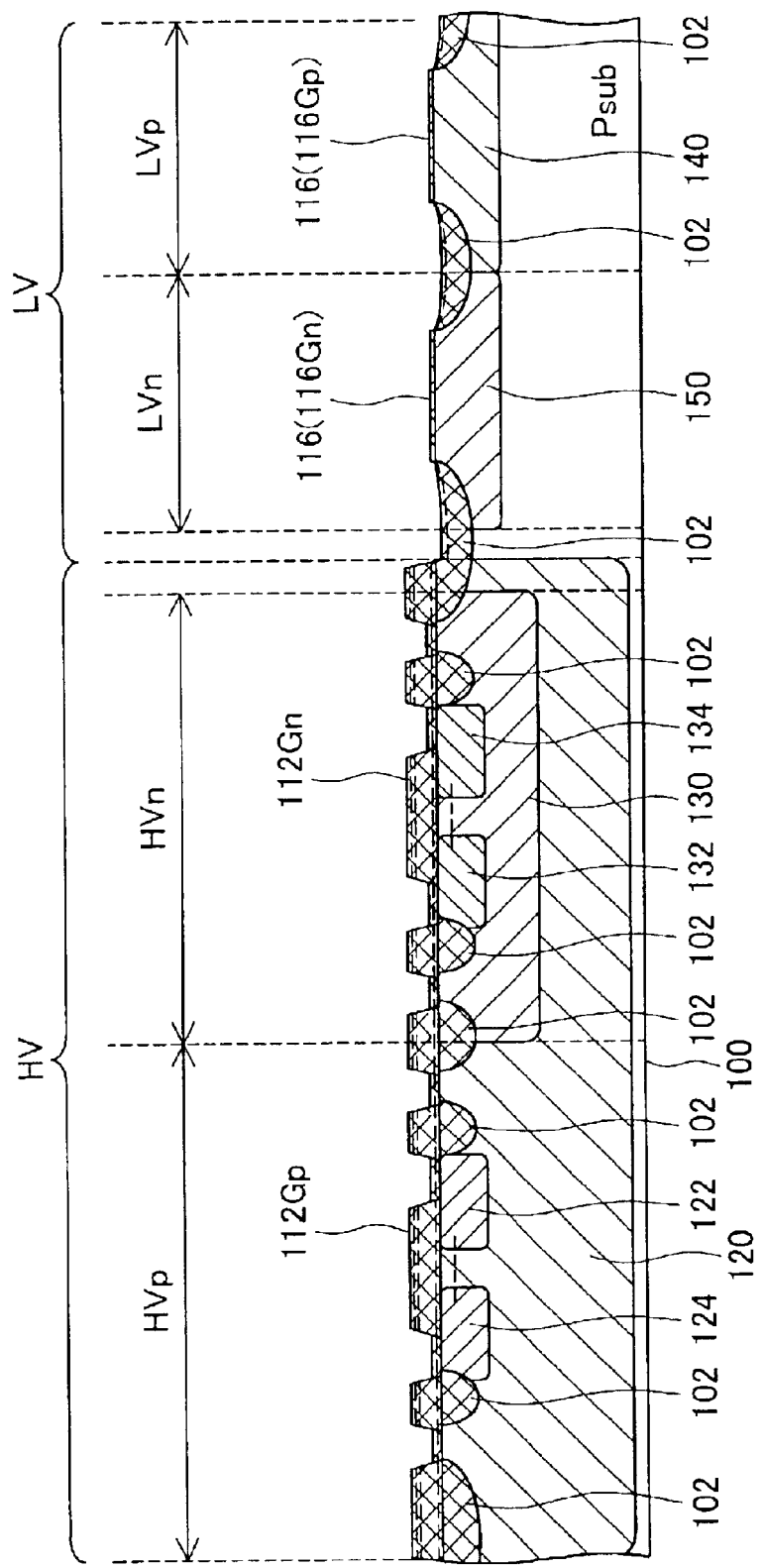

In Step S206 (FIG. 1), the gate oxide films for the low-breakdown voltage transistors are formed. FIGS. 16 and 17 are simplified cross-sections showing the process for forming the gate oxide films for the low-breakdown voltage transistors.

In FIG. 16, the tenth resist R10 is formed in order to protect the oxide film in region HV. The unnecessary portion of oxide film 114 in region LV exposed to the aperture of tenth resist R10 is removed by etching. After the etching process, tenth resist R10 is removed.

In FIG. 17, an oxide film is formed over the entire surface of substrate 100 by thermal oxidation. Specifically, the fourth oxide film 116 is formed in region LV. At this time, the thickness of oxide films on offset regions 122, 124, 132, 134 for the high-breakdown voltage transistors will increase, and the thickness of gate oxide films 112Gn, 112Gp of the high-breakdown voltage transistors will also increase. As a result, the thickness of fourth oxide film 116 is about 70 Angstroms, and the thickness of gate oxide films 112Gn, 112Gp increase to about 800 Angstroms. The fourth oxide film 116 formed in region LV will be used as gate oxide films 116Gn, 116Gp of the low-breakdown voltage transistors.

Figure 18:
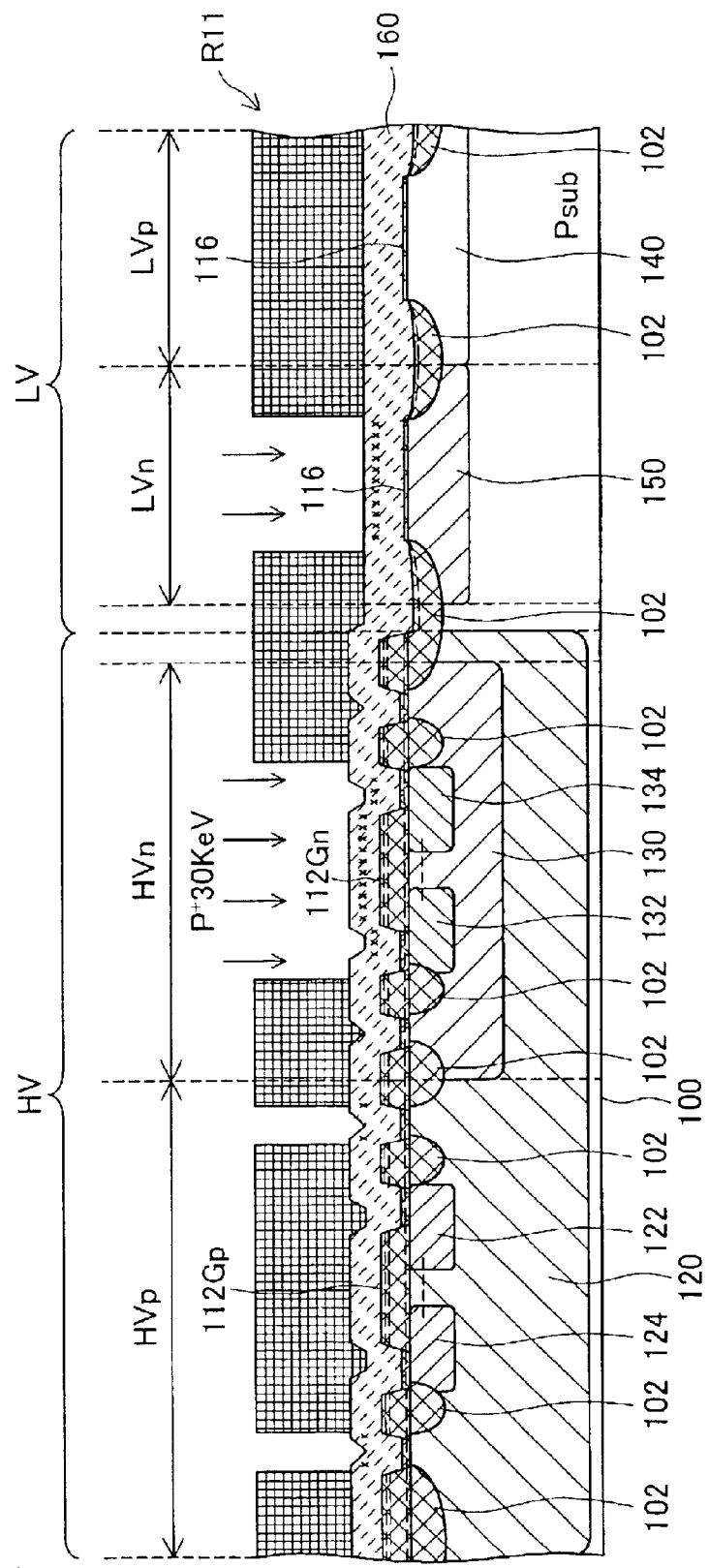
FIGS. 18, 19, and 20 are simplified cross-sections showing the process for forming the gates of the high-breakdown voltage transistors and the low-breakdown voltage transistors.
Figure 19:
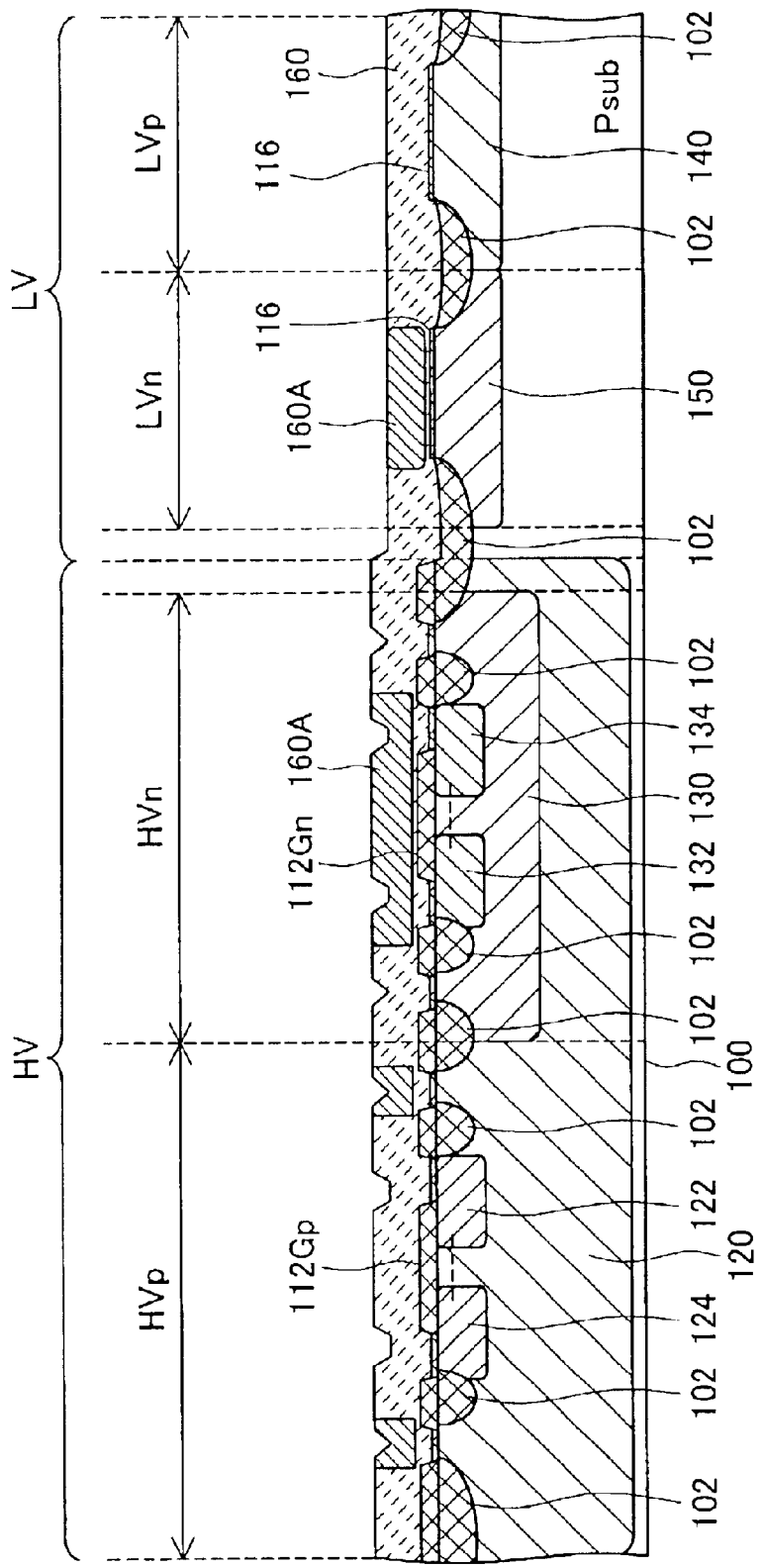
Figure 20:
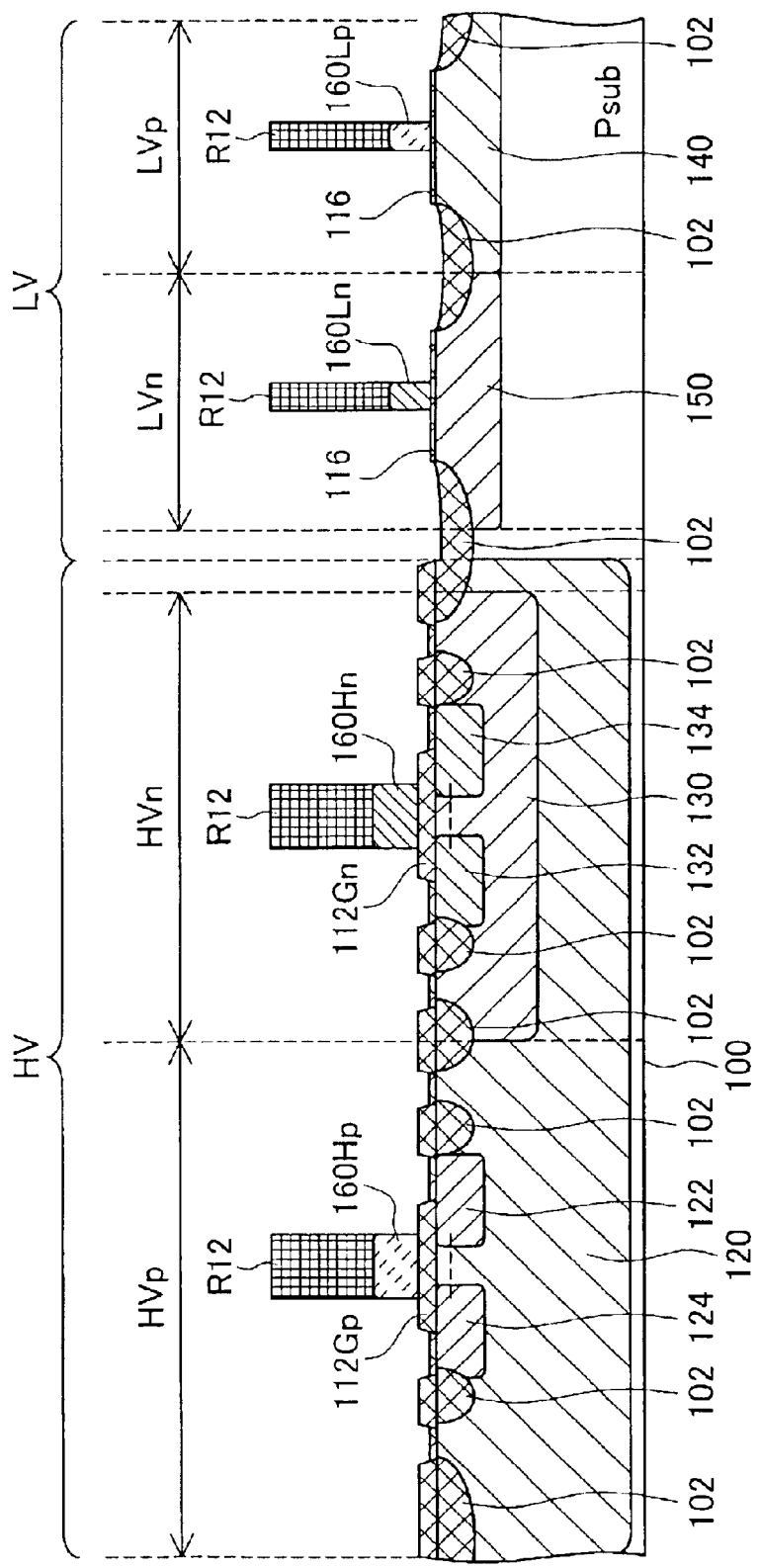

In Step S207 (FIG. 1), the gates of the transistors are formed. FIGS. 18, 19, and 20 are simplified cross-sections showing the process for forming the gates of the high-breakdown voltage transistors and the low-breakdown voltage transistors.

In FIG. 18, a polysilicon film is formed over the entire surface of substrate 100 by deposition. Then the eleventh resist R11 is formed. The resist R11 has apertures in the gate formation regions of the high- and low-breakdown voltage nMOS transistors. Then n-type impurities are introduced into polysilicon film 160 by ion implantation through the apertures in eleventh resist R11. In this case, phosphorus ions ($P^+$) having about 30 keV of energy are implanted. After ion implantation, eleventh resist R11 is removed. In FIG. 19, a heat treatment is performed that causes the implanted n-type impurities (phosphorus) to be dispersed into polysilicon film 160. In FIG. 20, the twelfth resist R12 is formed in order to protect the gate region for each transistor. The unnecessary portions of polysilicon film 160 exposed to the apertures in twelfth resist R12 is removed by etching. After etching, twelfth resist R12 is removed. As a result, in region HV, gate 160Hp of the high-breakdown voltage pMOS transistor is formed and gate 160Hn of the high-breakdown voltage nMOS transistor is formed. Also, in region LV, gate 160Lp of the low-breakdown voltage pMOS transistor is formed and gate 160Ln of the low-breakdown voltage nMOS transistor is formed. As shown in FIG. 20, gates 160Hp, 160Hn of the high-breakdown voltage transistors are formed in the center portions of gate oxide films 112Gp, 112Gn.

It should be noted that polysilicon is a polycrystalline semiconductor, so it has higher resistivity than metal. Therefore, when a gate is formed of polysilicon, impurities corresponding to channels for each transistor are implanted in order to lower the resistance of the polysilicon. In the Comparative Example, the reduction of polysilicon resistance will be also performed in the drain and source region formation process of Step S210 (FIG. 25), to be described below. However, the amount of ion implantation at this time is not enough to lower resistivity of the high- and low-breakdown voltage nMOS transistor gates. Therefore, in the processes shown in FIGS. 18 and 19, a preparatory lowering of resistivity is conducted at the polysilicon regions 160A which will form the high- and low-breakdown voltage nMOS transistor gates.

As shown in FIG. 18, eleventh resist R11 also has apertures in the area outside the gate formation region. This is because the common resist mask, to be used in the process shown in FIG. 25 explained later, is used. As shown in FIG. 20, this is not a problem because the polysilicon film 160 outside the gate formation regions is removed. Obviously, it is possible to form the resist in FIG. 18 so that there will not be any apertures in regions outside of the gate formation regions.

Figure 21:
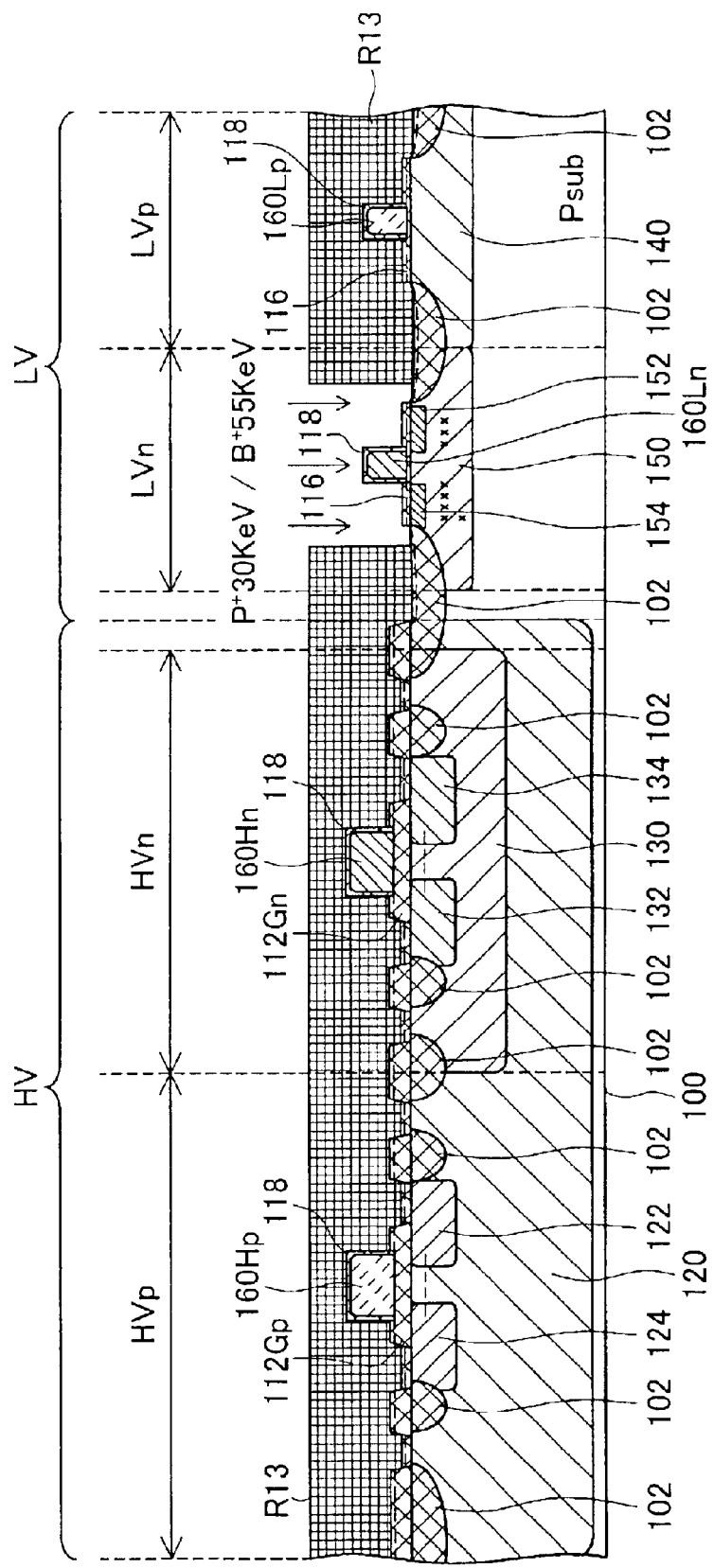
FIG. 21 is a simplified cross-section showing the process for forming the drain and source offset regions for the low-breakdown voltage nMOS transistor.
Figure 22:
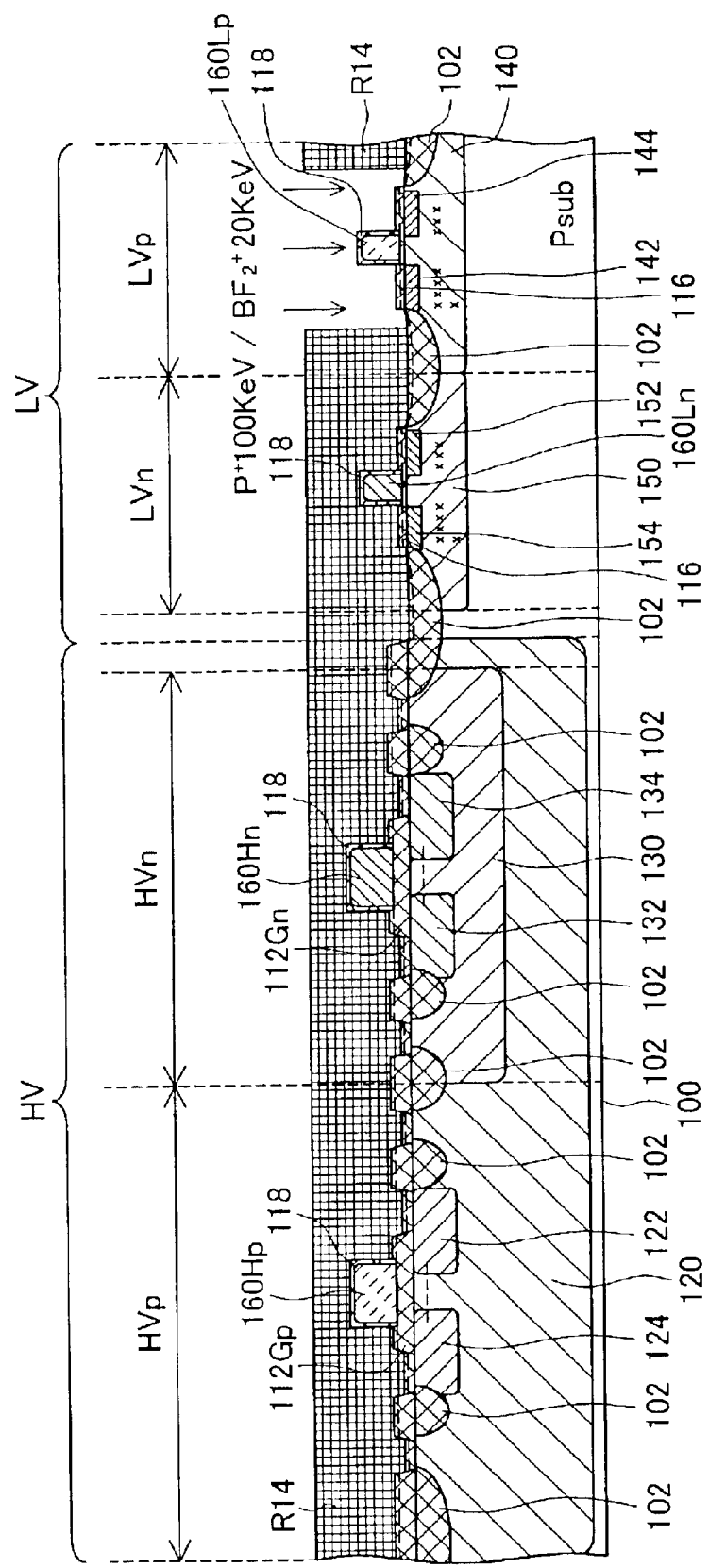
FIG. 22 is a simplified cross-section showing the process for forming the drain and source offset regions for the low-breakdown voltage pMOS transistor.

In Step S208 (FIG. 1), drain and source offset regions for the low-breakdown voltage transistors are formed. FIG. 21 is a simplified cross-section showing the process for forming the drain and source offset regions for the low-breakdown voltage nMOS transistor. FIG. 22 is a simplified cross-section showing the process for forming the drain and source offset regions for the low-breakdown voltage pMOS transistor.

In FIG. 21, the fifth oxide film 118 is formed over the entire surface of substrate 100 by deposition using reduced pressure CVD method. At this time, the oxide film 118 is also formed on the lateral surfaces of transistor gates 160Hp, 160Hn, 160Lp, 160Ln.

Then the thirteenth resist R13 is formed. The resist R13 has an aperture in region LVn. Then n-type impurities are introduced into a relatively shallow layer within p-well 150 by ion implantation through the aperture of thirteenth resist R13. In this case, phosphorus ions ($P^+$) having about 30 keV of energy are implanted. By this method, drain offset region 152 and source offset region 154 are formed. Further, p-type impurities are introduced into a relatively deep layer within p-well 150 by ion implantation. In this case, boron ions ($B^+$) having about 55 keV of energy are implanted. By this method, p-type layers with relatively high impurity concentration are formed at the lower layers of n-type offset regions 152, 154 within p-well 150. As a result, it is possible to improve the breakdown voltage of the low-breakdown voltage nMOS transistor.

In FIG. 22, the fourteenth resist R14 is formed. The resist R14 has an aperture in region LVP. Then p-type impurities are introduced into a relatively shallow layer within n-well 140 by ion implantation through the aperture of fourteenth resist R14. In this case, the boron fluoride ions ($BF_2^+$) having about 20 keV of energy are implanted. By this method, drain offset region 142 and source offset region 144 are formed. Further, n-type impurities are introduced into a relatively deep layer within n-well 140 by ion implantation. In this case, phosphorus ions ($P^+$) having about 100 keV of energy are implanted. By this method, n-type layers with relatively high impurity concentration are formed at the lower layers of p-type offset regions 142, 144 within n-well 140. As a result, it is possible to improve the breakdown voltage of the low-breakdown voltage pMOS transistor.

Note that the order of the offset region formation processes shown in FIGS. 21 and 22 can be reversed.

Figure 23:
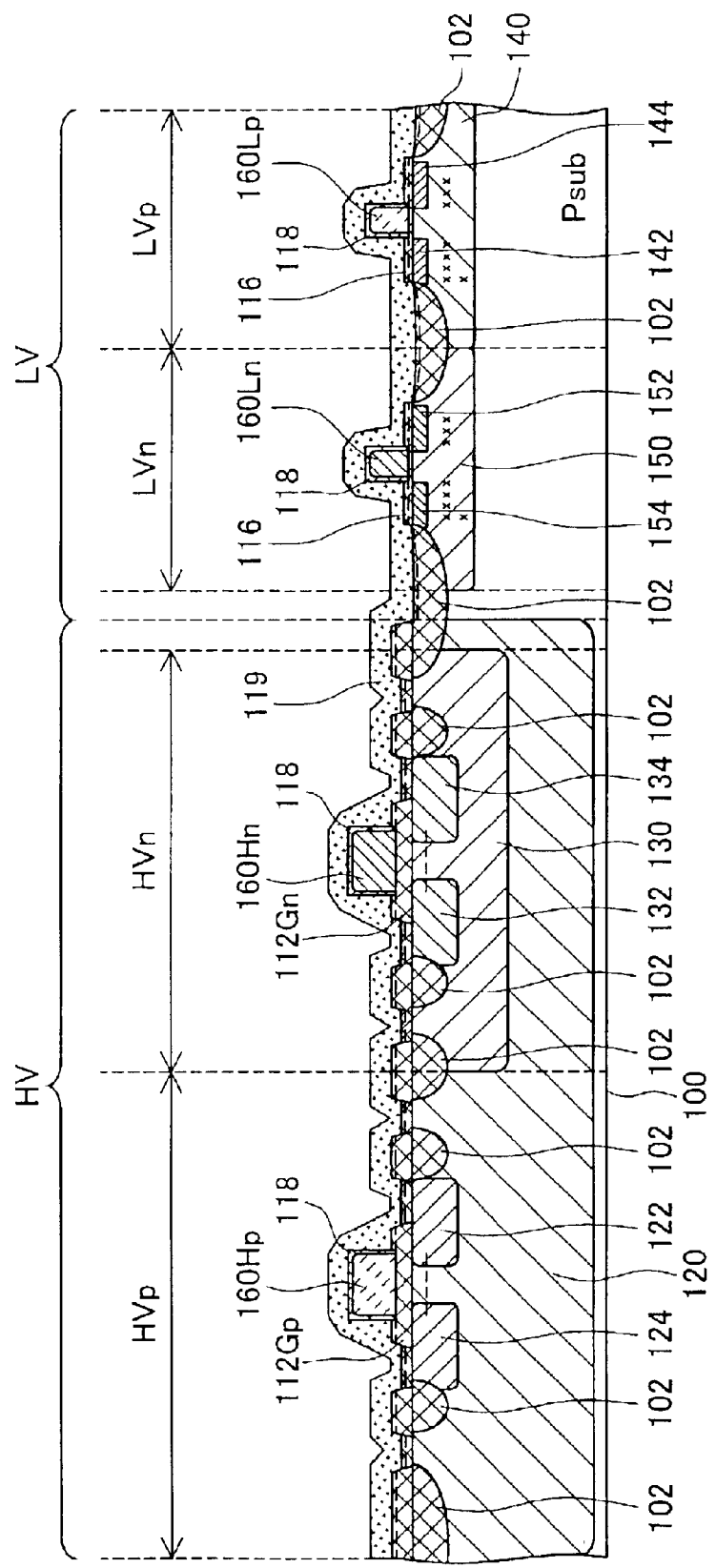
FIGS. 23 and 24 are simplified cross-sections showing the process for forming the sidewalls for the low-breakdown voltage transistors.
Figure 24:
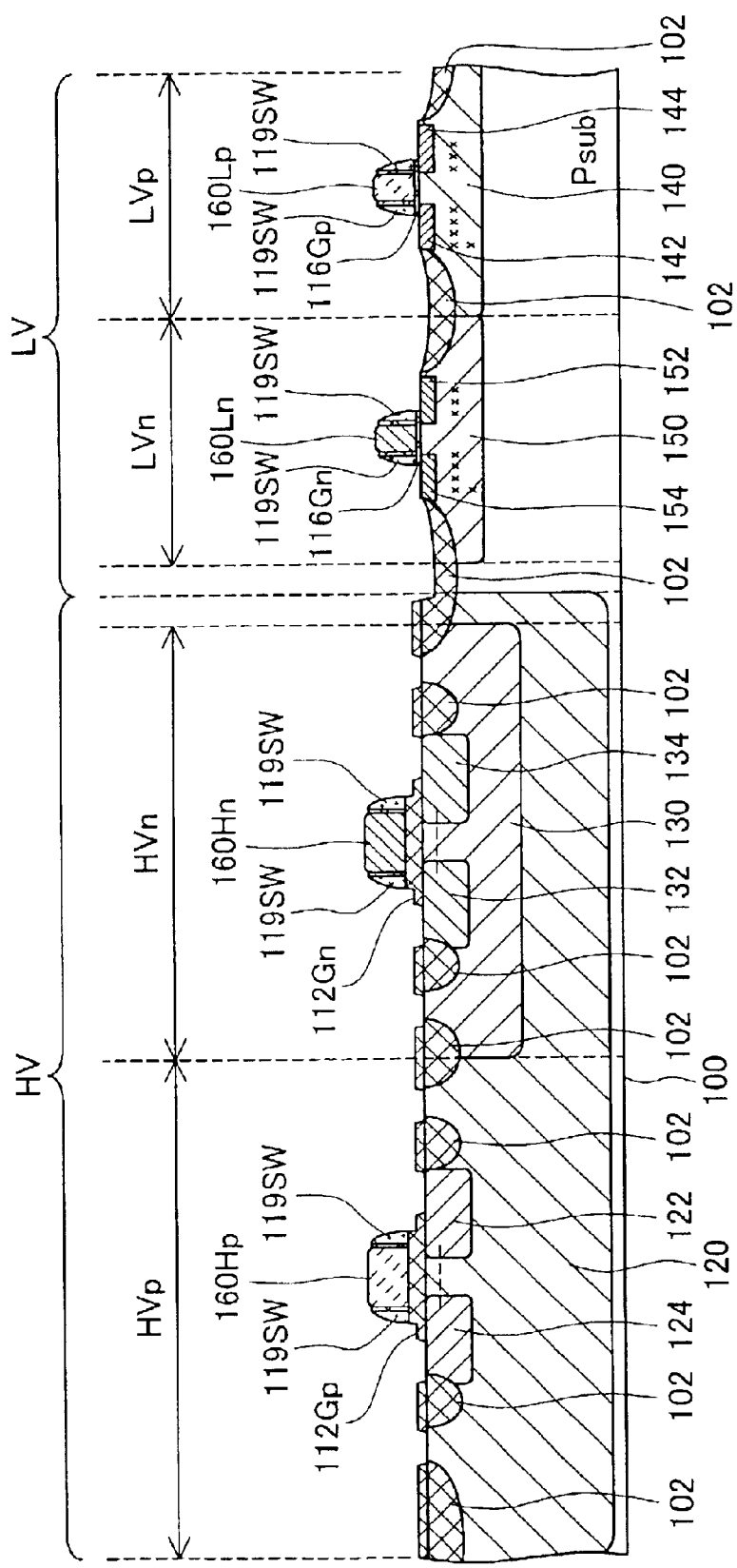

In Step S209 (FIG. 1), the sidewalls for the low-breakdown voltage transistors are formed. Specifically, sidewalls are formed at the sides of gates 160Ln, 160Lp of the low-breakdown voltage nMOS and pMOS transistors, which function as masks for the formation of drain and source regions. FIGS. 23 and 24 are simplified cross-sections showing the process for forming the sidewalls for the low-breakdown voltage transistors.

In FIG. 23, the sixth oxide film 119 is formed over the entire surface of substrate 100 by deposition. Then sidewalls are formed by anisotropic etching such as reactive ion etching (RIE). In FIG. 24, sidewalls 119SW are formed on the sides of gates 160Lp, 160Ln of the low-breakdown voltage pMOS and nMOS transistors. Also, sidewalls 119SW are formed on the sides of gates 160Hp, 160Hn of the high-breakdown voltage pMOS and nMOS transistors.

During the formation of sidewalls 119SW, etching is performed until apertures are formed in the oxide films on the offset regions for each transistor. Once etching has been completed, oxide films 118, 119 covering the upper surfaces of gates 160Hp, 160Hn, 160Lp, 160Ln of the transistors are completely removed.

Figure 25:
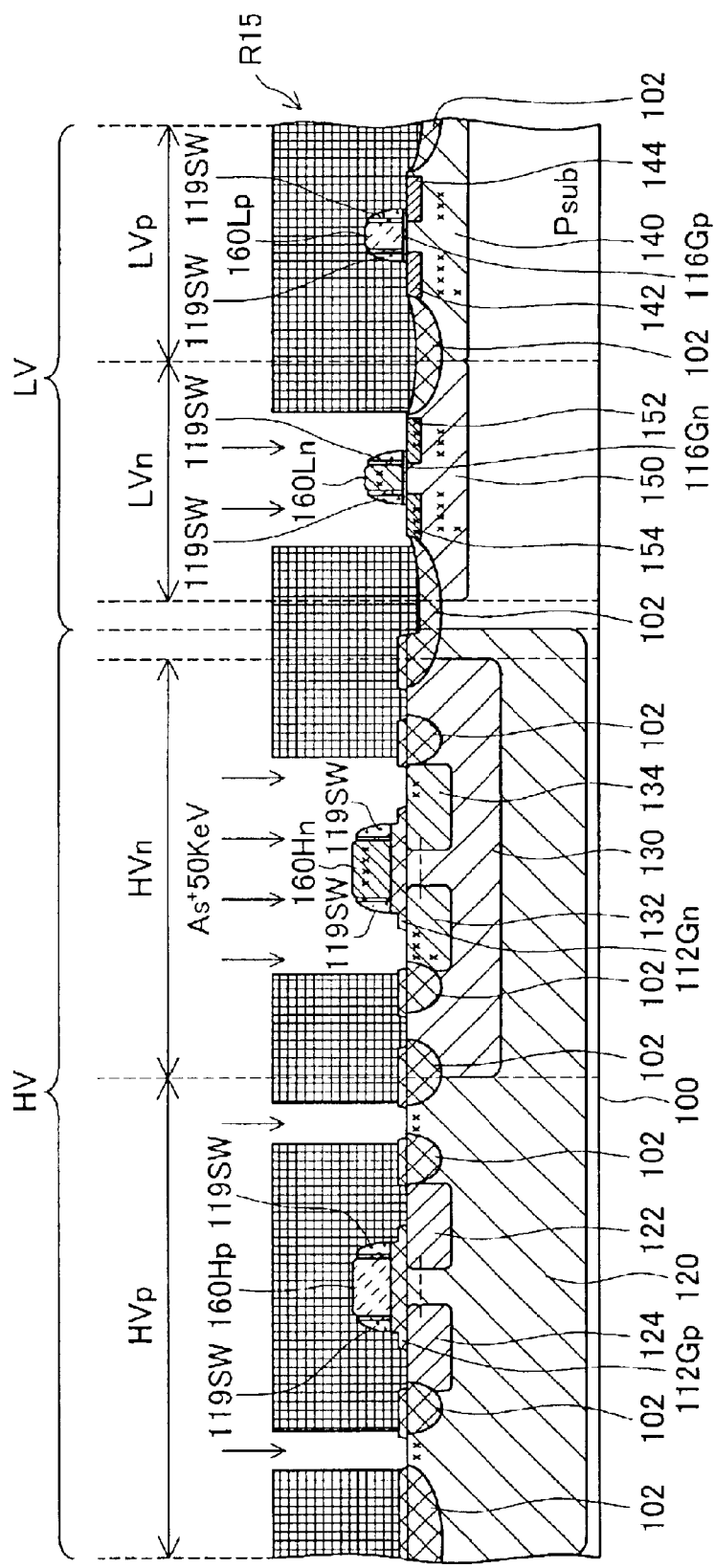
FIGS. 25, 26, and 27 are simplified cross-sections showing the process of forming the drain and source regions of the high-breakdown voltage transistors and the low-breakdown voltage transistors.
Figure 26:
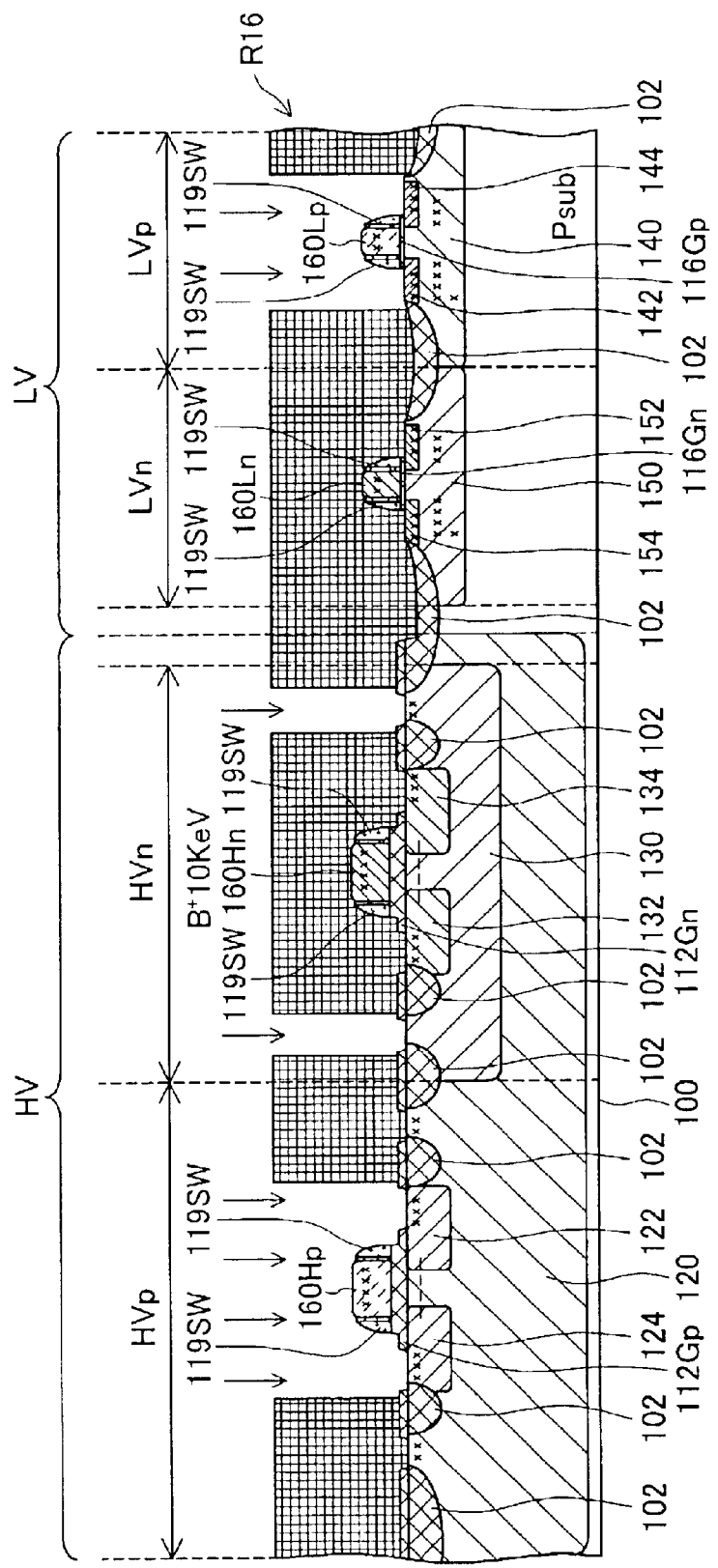
Figure 27:
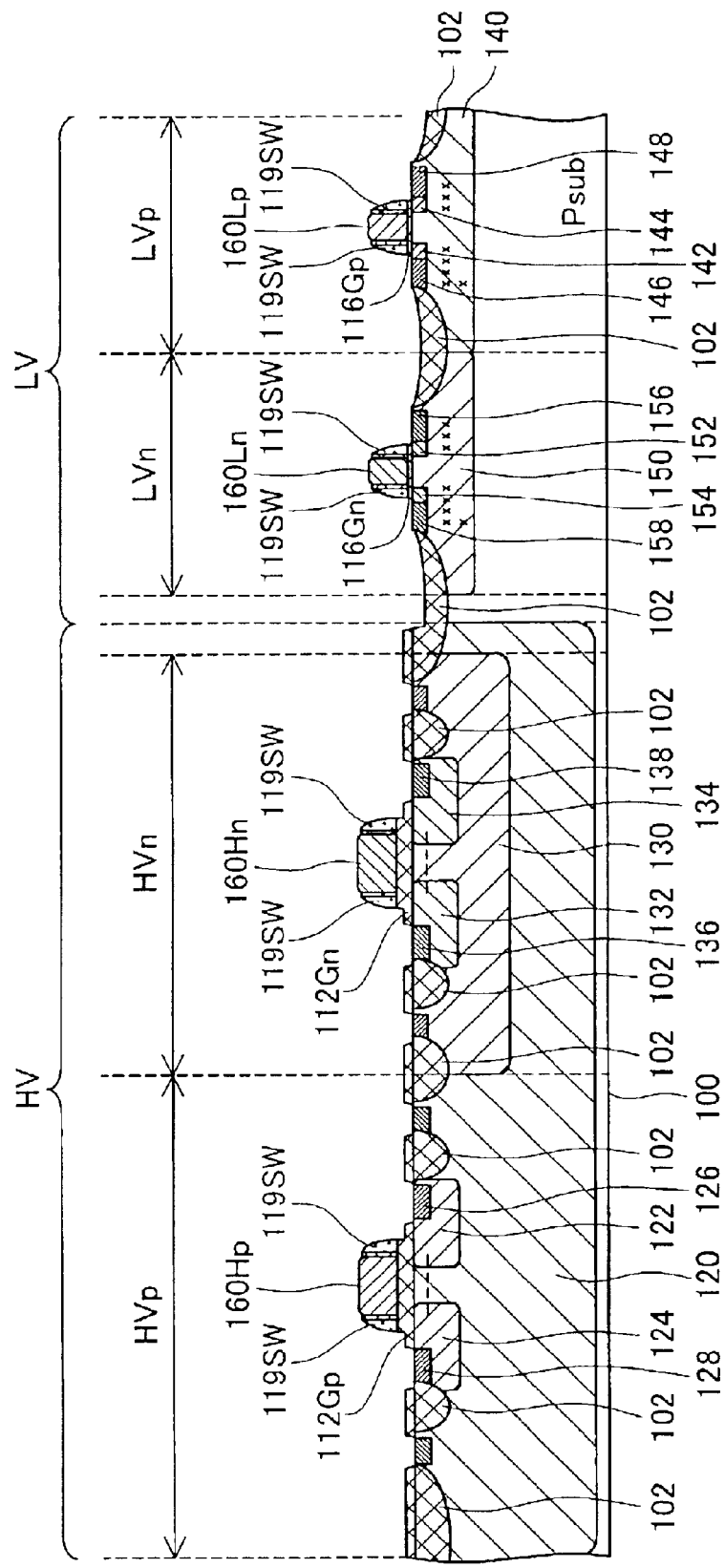

In Step S210 (FIG. 1), the drain and source regions of the transistors are formed. FIGS. 25, 26, and 27 are simplified cross-sections showing the process of forming the drain and source regions of the high-breakdown voltage transistors and the low-breakdown voltage transistors.

In FIG. 25, the fifteenth resist R15 is formed. The resist R15 has apertures in regions HVn and LVn. Then n-type impurities are introduced into offset regions 132, 134, 152, 154 for the high- and low-breakdown voltage nMOS transistors, by ion implantation through the apertures in fifteenth resist R15. In this case, arsenic ions (As$^+$) having about 50 keV of energy are implanted. In FIG. 26, the sixteenth resist R16 is formed. The resist R16 has apertures in regions HVp and LVp. Then p-type impurities are introduced into offset regions 122, 124, 142, 144 for the high- and low-breakdown voltage pMOS transistors, by ion implantation through the apertures in sixteenth resist R16. In this case, boron ions (B$^+$) having about 10 keV of energy are implanted. Note that the order of the ion implantation processes shown in FIGS. 25 and 26 can be reversed.

In FIG. 27 a heat treatment is performed to disperse the impurities implanted in FIGS. 25 and 26. As a result, a drain region 126 and a source region 128 are formed in the two respective offset regions 122 and 124 for the high-breakdown voltage pMOS transistor, and a drain region 136 and a source region 138 are formed in the two respective offset regions 132 and 134 for the high-breakdown voltage nMOS transistor. Similarly, a drain region 146 and a source region 148 are formed in the two respective offset regions 142 and 144 for the low-breakdown voltage pMOS transistor, and a drain region 156 and a source region 158 are formed in the two respective offset regions 152 and 154 for the low-breakdown voltage nMOS transistor.

As shown in FIGS. 25 and 26, the drain and source regions of the high-breakdown voltage transistors are formed in a self-aligned manner, with the gate oxide film functioning as a mask. The drain and source regions of the low-breakdown voltage transistors are also formed in a self-aligned manner, with the gate and sidewalls functioning as a mask.

In FIG. 25, the n-type impurities are also implanted into the polysilicon gates 160Hn, 160Ln of the high- and low-breakdown voltage nMOS transistors, and in FIG. 26, the p-type impurities are also implanted into the polysilicon gates 160Hp, 160Lp of the high- and low-breakdown voltage pMOS transistors. In FIG. 27, a heat treatment is conducted which lowers the resistance of polysilicon gates 160Hn, 160Ln, 160Hp, 160Lp of the transistors.

In FIG. 25, impurities are further implanted in regions outside the high-breakdown voltage pMOS transistor (namely, in regions interposed between field oxide films 102). Similarly, in FIG. 26, impurities are further implanted in regions outside the high-breakdown voltage nMOS transistor. This makes it possible to securely isolate the transistors from each other.

Figure 28:
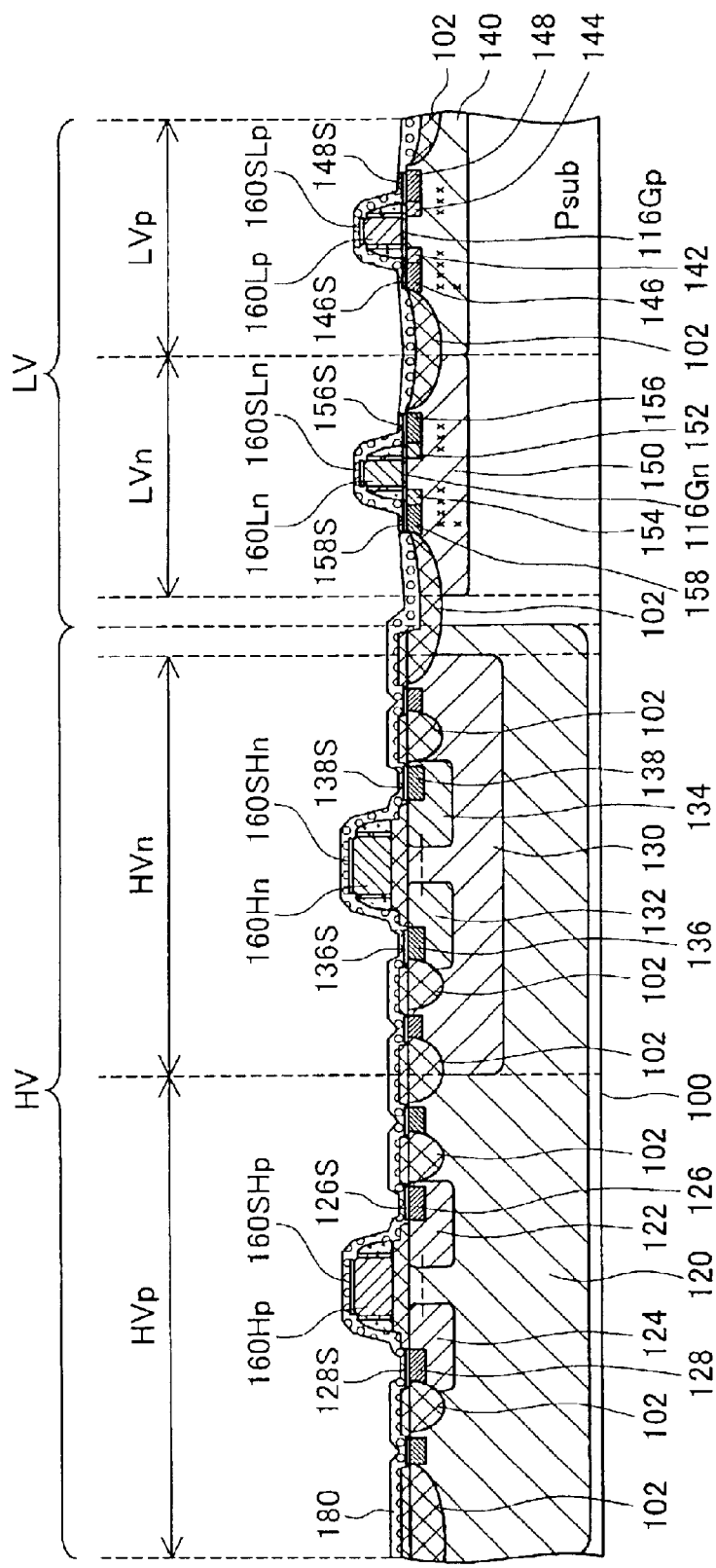
FIGS. 28 and 29 are simplified cross-sections showing the process of silicide formation.
Figure 29:
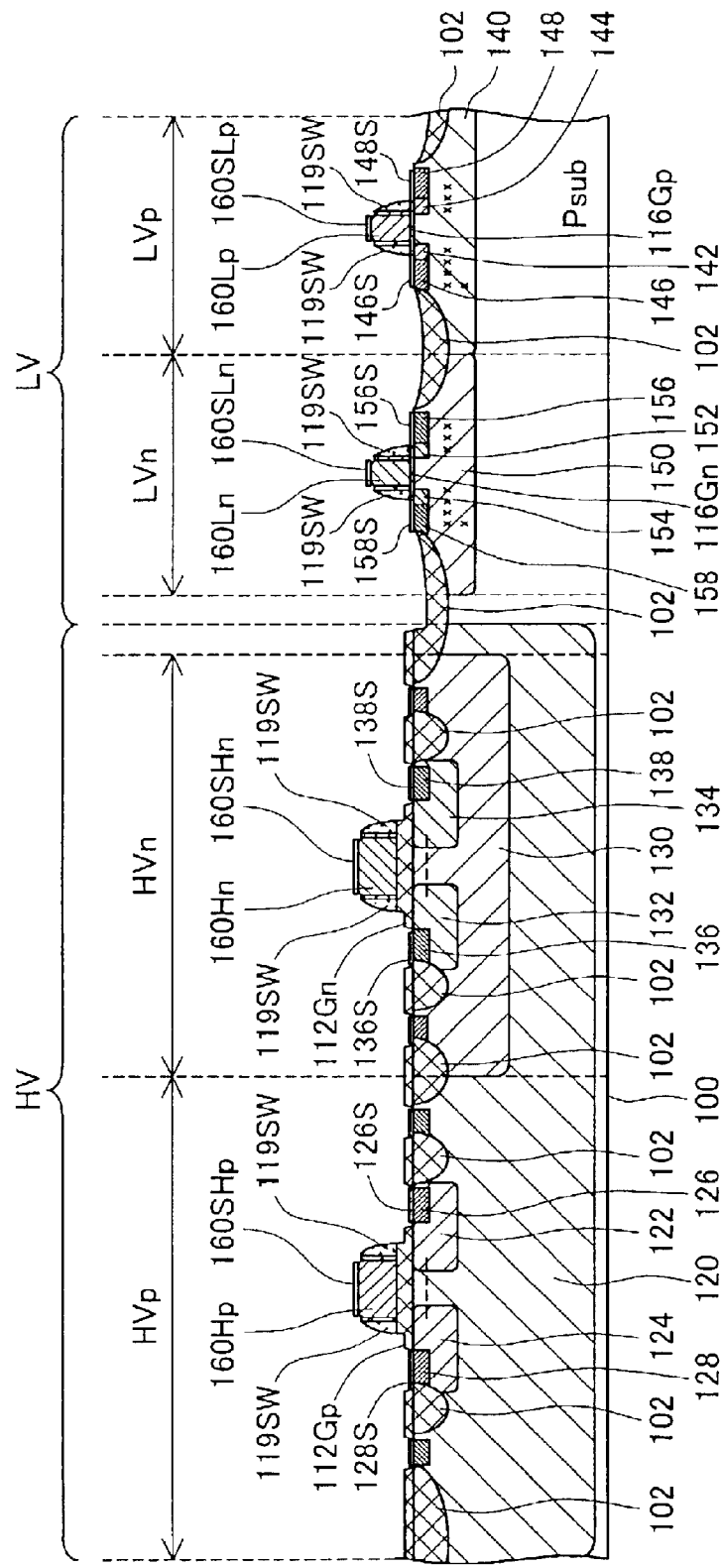

In Step S211 (FIG. 1), silicide is formed on the surface layers of the gates and on the surface layers of the drain and gate regions of each transistor. Here silicide refers to a binary compound of silicon and metal. FIGS. 28 and 29 are simplified cross-sections showing the process of silicide formation.

In FIG. 28, titanium film (Ti film) 180 is formed over the entire surface of substrate 100 by sputtering. Best results are obtained if Ar ions are implanted into substrate 100 as a preliminary process for the titanium film formation. Then a heat treatment is performed. At this time, silicon and titanium are compounded, and silicide is formed on the portions where the silicon and titanium come into contact, namely on the surface layers of the gates and of the drain and source regions of each transistor. Specifically, silicides 160SHp, 160SHn, 160SLp, 160SLn are formed on the surface layers of gates of each transistor. Also, silicides 126S, 136S, 146S, 156S, 128S, 138S, 148S, 158S are formed on the surface layers of the drain and source regions of each transistor. In FIG. 29, the titanium layer 180 is removed in a self aligned manner by etching while leaving the silicide. This is then subjected to a heat treatment in order to reduce the resistivity of the silicide.

When the element formation process described above has been completed, Step S300 for the wiring process (FIG. 1) is performed. In the wiring process, metal wires such as Al are connected to the silicide formed on the surface layers of the gates and of the drains and sources of each transistor. In other words, the silicide functions as a contact layer for connecting a metallic wire.

As explained above, the element formation process of the Comparative Example has certain processes in common (such as Steps S207, S210, S211), which makes it possible to efficiently form both a high-breakdown voltage transistor and a low-breakdown voltage transistor on the same substrate.

Figure 30:
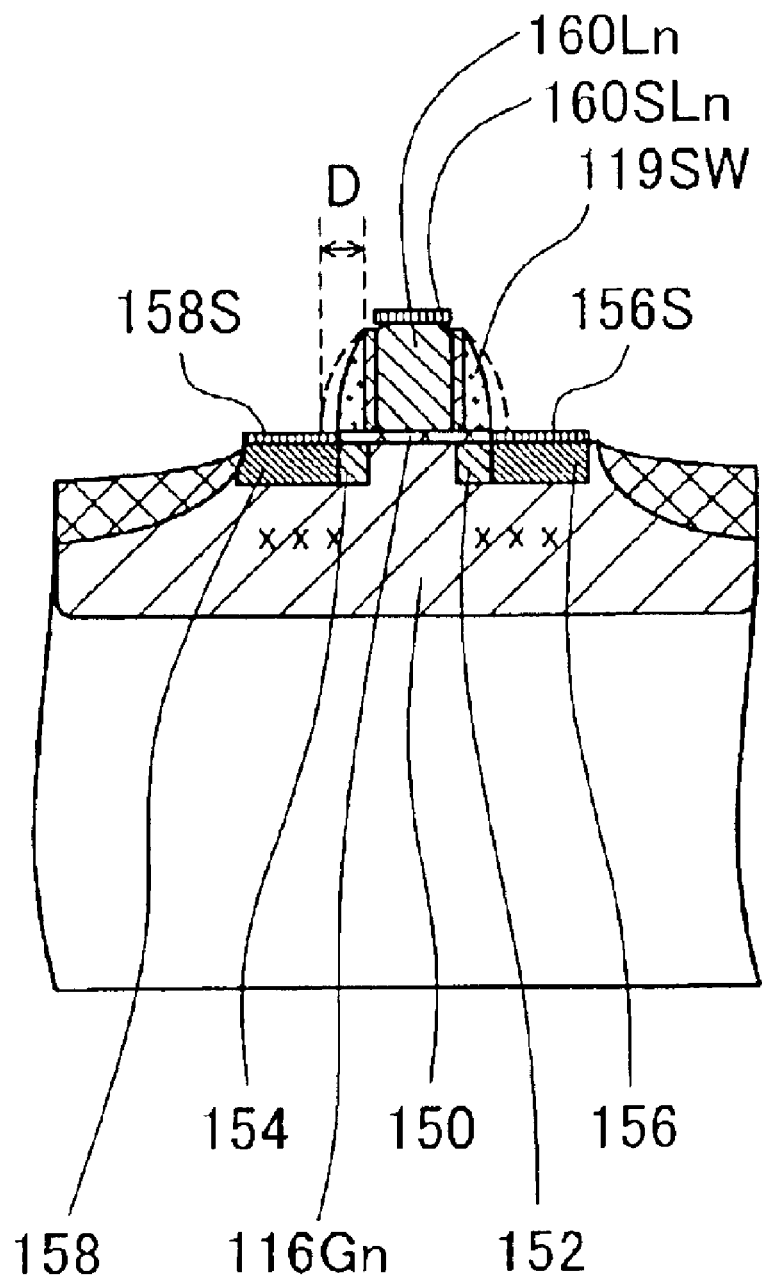
FIG. 30 is a simplified cross-section showing the structural characteristics of the low-breakdown voltage transistor manufactured according to the element formation process of the Comparative Example (FIGS. 2 through 29)

A-2. Characteristics of Semiconductor Device Made According to Manufacturing Method of Comparative Example:

FIG. 30 is a simplified cross-section showing the structural characteristics of the low-breakdown voltage transistor manufactured according to the element formation process of the Comparative Example (FIGS. 2 through 29). Although FIG. 30 shows the low-breakdown voltage nMOS transistor, the characteristics are similar for the low-breakdown voltage pMOS transistor.

In Step S209 (FIG. 1) for the sidewall formation process (FIGS. 23 and 24), etching is performed continuously until apertures are formed in the oxide film above the offset regions of the transistors. Namely, in FIG. 23, prior to the deposition of the sixth oxide film 119, the thickness of the oxide film covering the drain and source formation regions for the high-breakdown voltage transistors is greater than that covering the drain and source regions for the low-breakdown voltage transistors. Therefore, the oxide film on the low breakdown voltage area is removed before the oxide film on the high breakdown voltage area. Then etching is performed continuously until the relatively thick oxide film covering the drain and source formation regions for the high breakdown voltage transistor is removed. Therefore, for example, by delaying the etching stop timing, sometimes excessive etching will occur and, as shown in FIG. 30, the width of the sidewalls 119SW for the low-breakdown voltage transistor will be less than the design value D. In such cases, the process for forming the drain and source regions in Step S210 (FIGS. 25–27) results in the formation of drain region 156 and source region 158 closer to gate 160Ln. In the silicide formation process of Step S211 (FIGS. 28 and 29), silicides 156S and 158S are formed closer to gate 160Ln. This results in narrowing the interval between the drain and source regions, which lowers the drain breakdown voltage.

Figure 31A:
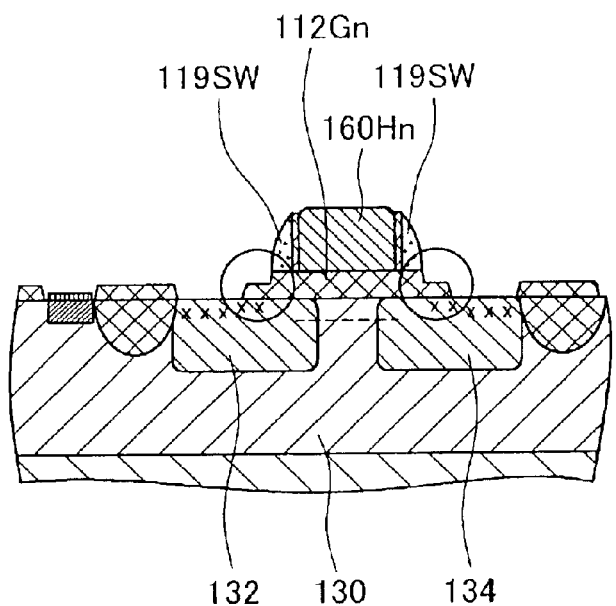
FIGS. 31(A), 31(B) and 32 are simplified cross-sections showing the structural characteristics of the high-breakdown voltage transistor manufactured according to the element formation process of the Comparative Example (FIGS. 2 through 29)
Figure 31B:
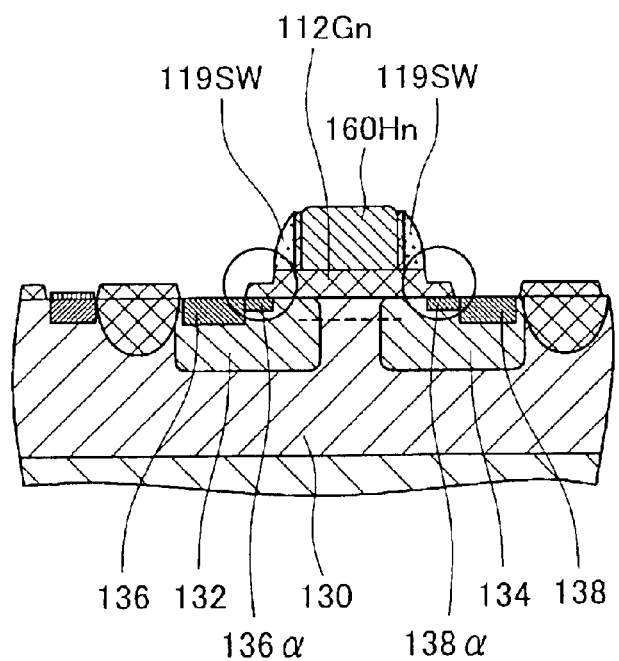
Figure 32:
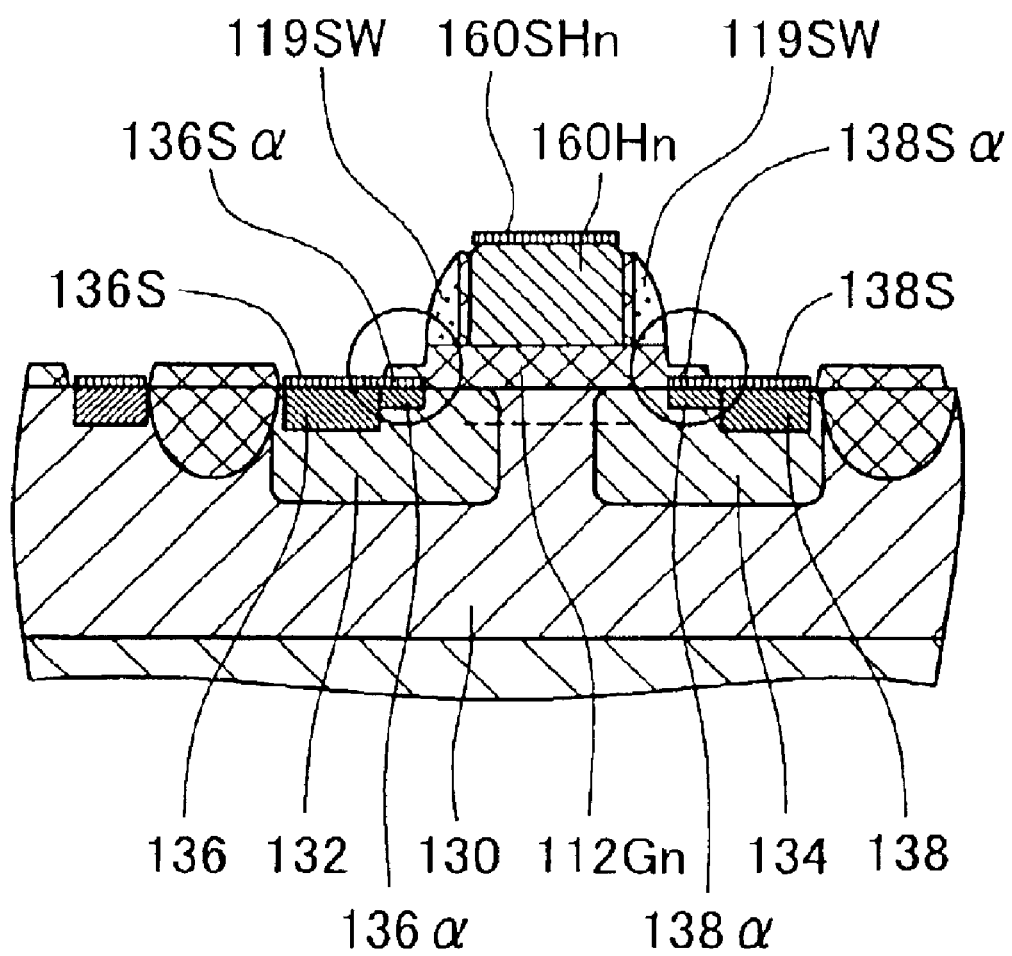

FIGS. 31(A), 31(B) and 32 are simplified cross-sections showing the structural characteristics of the high-breakdown voltage transistor manufactured according to the element formation process of the Comparative Example (FIGS. 2 through 29). Although FIGS. 31(A), 31(B) and 32 show a high-breakdown voltage nMOS transistor, the characteristics are similar for the high-breakdown voltage pMOS transistor.

As described above, in Step S209 (FIG. 1) for the sidewall formation process (FIGS. 23 and 24), etching is performed continuously until apertures are formed in the oxide film above the offset regions of the transistors. At this time, the gate oxide film 112Gn of the high-breakdown voltage nMOS transistor is over-etched. Therefore, as shown in FIGS. 31(A), 31(B) and 32, the portions around gate oxide film 112Gn (namely, the portions that have been circled in the diagram, where sidewall 119SW has not been formed) are thinner than the central portion.

If excessive etching occurs, a problem may arise during the Step S210, the process for forming the drain and source regions (FIGS. 25–27), where impurities are also implanted into offset regions 132, 134 in the lower layers around gate oxide film 112Gn, as shown in FIG. 31(A). In such cases, as shown in FIG. 31(B), drain region 136α and source region 138α will also be formed in the lower layers around gate oxide film 112Gn, which narrows the interval between the drain and source regions, thus lowering drain breakdown voltage.

Further, during the silicide formation process of Step S211 (FIGS. 28 and 29), as shown in FIG. 32, excessive etching causes the formation of silicides 136Sα, 138Sα on the surface of the lower layers around gate oxide 112Gn. In such cases, the interval between silicides 136Sα, 138Sα formed in the drain and source regions will narrow, which reduces drain breakdown voltage. Even if impurities are not implanted into the lower layers around gate oxide film 112Gn, silicides 136Sα, 138Sα will still be formed.

As explained above, the sidewalls of the low-breakdown voltage transistor formed by the manufacturing process of the Comparative Example are too thin, which results in lowering the drain breakdown voltage. Similarly, the peripheral portions of the gate oxide film of the high-breakdown voltage transistor are too thin, which results in lowering the drain breakdown voltage.

In the embodiments described below, the manufacturing process has been designed to eliminate the problems described above.

B. First Embodiment:

The manufacturing process of the First Embodiment follows the flowchart of FIG. 1, as is the case for the Comparative Example. However, the contents of Step S209 for sidewall formation process, Step S210 for drain and source region formation process, and Step S211 for silicide formation process are changed.

In this embodiment, Step S209 for sidewall formation process is designed so that when the oxide film over the drain and source formation regions for each transistor is removed, the width of the sidewalls will not become too narrow, such as is shown in FIG. 30. Namely, in the Comparative Example (FIG. 23) oxide film 119 is deposited in order to form the sidewalls, but in the First Embodiment a nitride film is deposited instead of an oxide film, and nitride sidewalls are formed by anisotropic etching.

Figure 33:
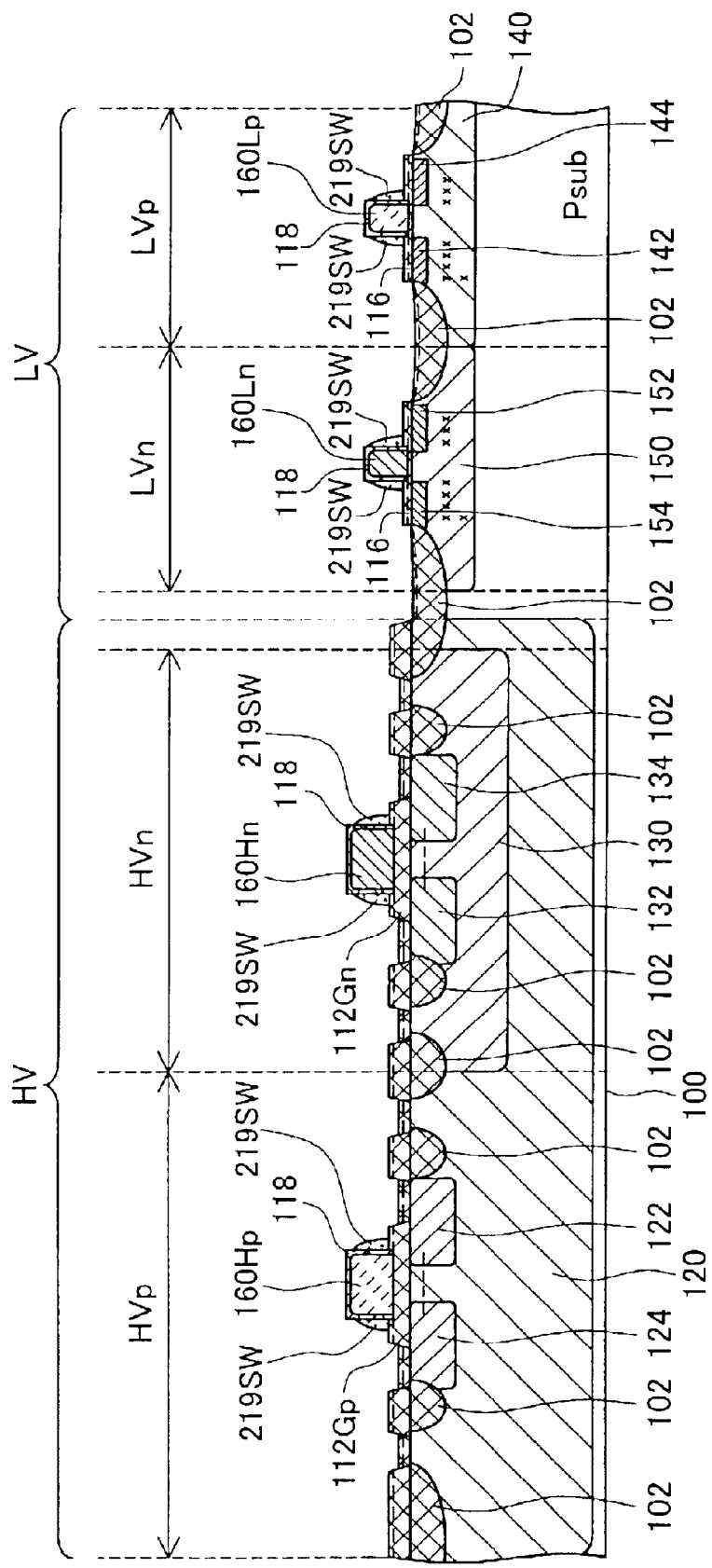
FIG. 33 is a simplified cross-section showing the situation when sidewalls are formed on the sides of the gates of the low-breakdown voltage transistors.

FIG. 33 is a simplified cross-section showing the situation when sidewalls are formed on the sides of the gates of the low-breakdown voltage transistors. By forming a nitrite film instead of the oxide film 119 in FIG. 23, the nitride film can be selectively etched, thus leaving the oxide film as it is on substrate 100, as shown in FIG. 33. The sidewalls 219SW of nitride are thus formed on the sides of the low-breakdown voltage transistor gates 160Lp, 160Ln.

Once the sidewalls 219SW are formed, the next step is to selectively etch the oxide layer. Since the nitride is not etched during this step, the dimensions for the width of sidewall 219SW are maintained. As is the case with the Comparative Example, the oxide film etching is performed on the relatively thick oxide film above the high-breakdown voltage transistor drain and source formation regions and the relatively thin oxide film above the high-breakdown voltage transistor drain and source formation regions, until both are removed. The situation after the etching process is shown in FIG. 24.

By selectively etching the nitride film and oxide film in this way, it is possible to etch the oxide film above the drain and source formation regions for the high-breakdown voltage transistors without reducing the width of sidewalls formed on the sides of the low-breakdown voltage transistor gates. When the oxide film is etched, the sidewalls are not etched, so the distance between the drain and source regions of the low-breakdown voltage transistor can be maintained with good precision, thus making it possible to reduce the lowering of drain breakdown voltage.

As shown in FIG. 33, in this embodiment, oxide film 118 is formed between sidewalls 219SW formed of nitride and gate formed of polysilicon. If the oxide film is not disposed between the polysilicon and the nitride film, stresses arising from the formation of the nitride film will tend to cause peeling and cracking between the gate and the sidewalls. But, by employing the structure of this embodiment, the stresses arising from nitride film formation are relaxed, thus making it possible to reduce the occurrence of peeling and cracking.

As shown in FIG. 33, in this embodiment, oxide films 116, 112Gn, 112Gp are formed between the silicon substrate 100 and the sidewalls 219SW formed of nitride. If the oxide films are not disposed between the silicon and the nitride film, the fixed charge trapped in the silicon-nitride film interface will cause the interface state to be unstable. But the structure of this practical example makes it possible to stabilize the interface state between the silicon substrate and the oxide film, which in turn makes it possible to stabilize transistor characteristics.

In this embodiment, Step S210 for drain and source region formation process is designed so that no impurities are implanted into lower level offset regions 122, 124, 132, 134 around the gate oxide films 112Gp, 112Gn of the high-breakdown voltage transistors, as shown in FIG. 31(A) and 31(B).

Figure 34:
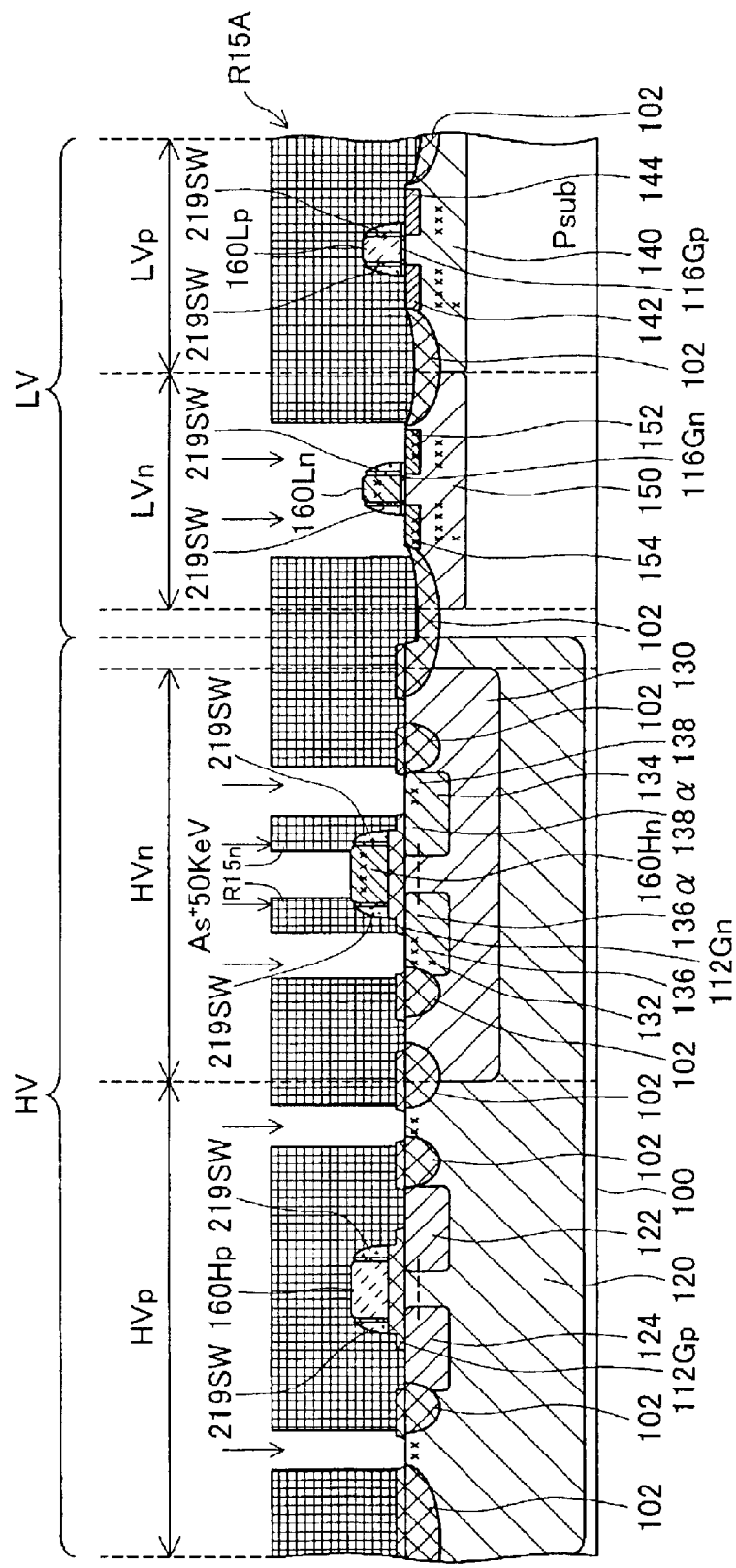
FIGS. 34 and 35 are simplified cross-sections showing the process for forming the drain and source regions of the high- and low-breakdown voltage transistors in the First Embodiment.
Figure 35:
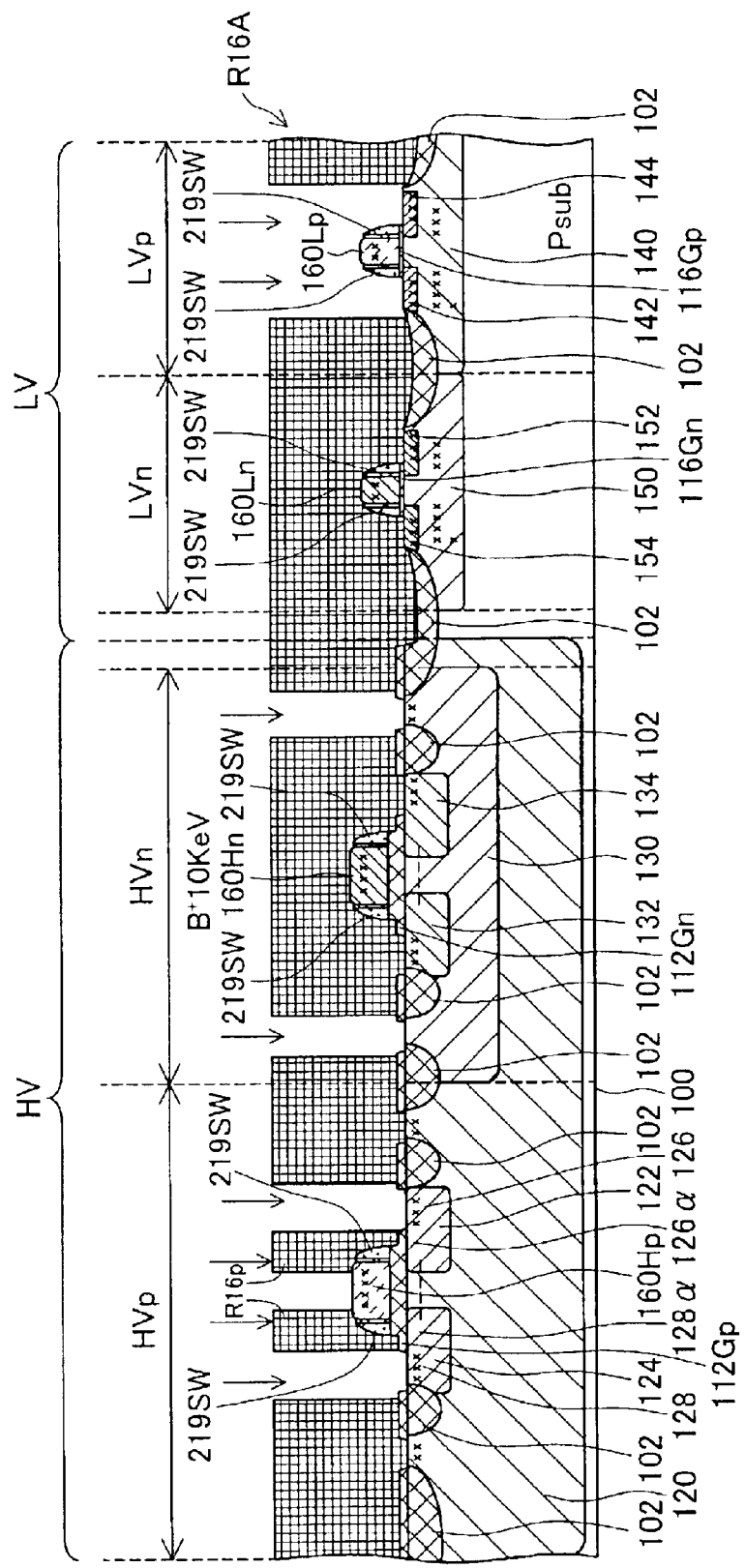

FIGS. 34 and 35 are simplified cross-sections showing the process for forming the drain and source regions of the high- and low-breakdown voltage transistors in the First Embodiment. The processes shown in FIGS. 34 and 35 are performed instead of those shown in FIGS. 25 and 26 of the Comparative Example.

As can be seen by comparing FIG. 34 with FIG. 25, the fifteenth resist R15A is changed in FIG. 34. The resist R15A includes the resist portions R15n covering sidewalls 219SW and the vicinity of gate oxide film 112Gn of the high-breakdown voltage nMOS transistor. Also, as can be seen by comparing FIG. 35 with FIG. 26, the sixteenth resist R16A is changed in FIG. 35. The resist R16A includes resist portions R16p covering sidewalls 219SW and the vicinity of gate oxide film 112Gp of the high-breakdown voltage pMOS transistor.

The use of resists R15A and R16A, in which resists R15n and R16p function as masks, makes it possible to prevent implantation of impurities into the lower layer areas of gate oxide films 112Gn, 112Gp, which results in reducing the lowering of drain breakdown voltage.

In FIGS. 34 and 35, the resists R15A and R16A (resist portions R15n and R16p) are formed so as to cover the edges on the periphery of the upper surfaces of gates 160Hn, 160Hp.

Further, in this embodiment, Step S211 for silicide formation process is designed so that silicide will be not formed on the surface layers of the lower layer regions surrounding gate oxide films 112Gn, 112Gp of the high-breakdown voltage transistors, such as is shown in FIG. 32. Specifically, a protective film is used to prevent the formation of silicide in the lower layer region of the gate oxide film.

Figure 36:
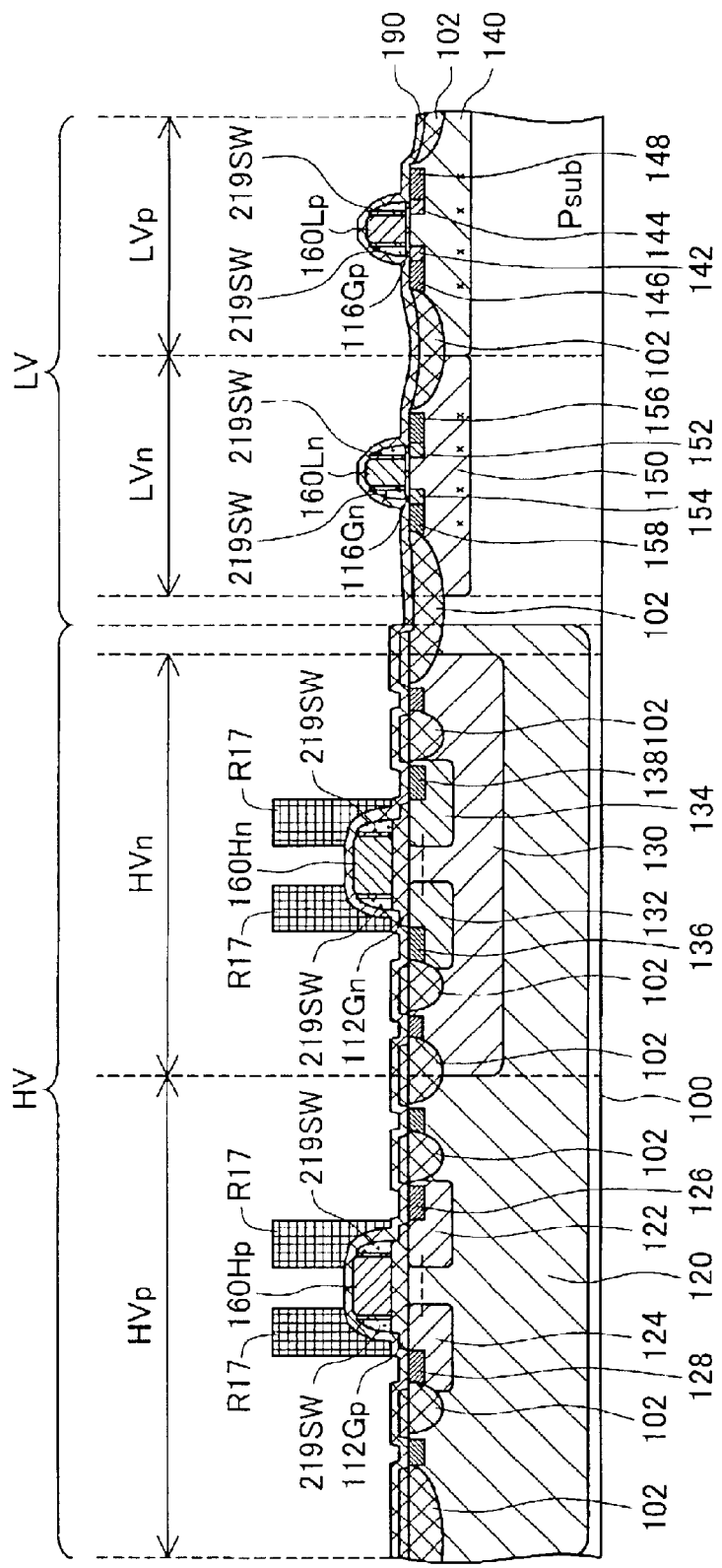
FIGS. 36 and 37 are simplified cross-sections showing the process for forming the protective films on the peripheral portions of the gate oxide films of the high-breakdown voltage transistors in the First Embodiment.
Figure 37:
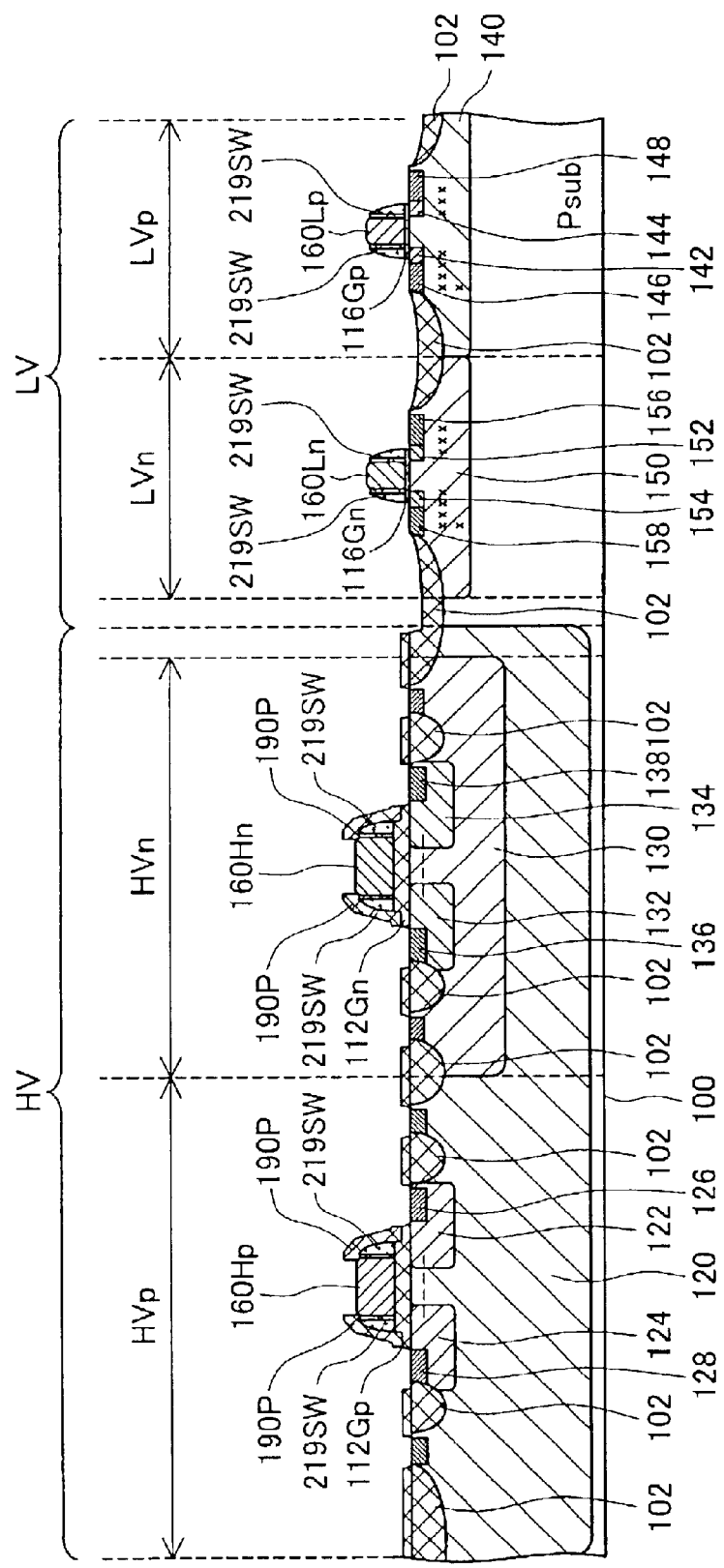

FIGS. 36 and 37 are simplified cross-sections showing the process for forming the protective films on the peripheral portions of the gate oxide films of the high-breakdown voltage transistors in the First Embodiment. Note that the process for forming the protective film shown in FIGS. 36 and 37 is performed before the formation of the titanium film 180 shown in FIG. 28.

In FIG. 36, the seventh oxide film 190 is formed over the entire surface of substrate 100 by deposition. The oxide film 190 has a thickness of about 700 angstroms. Then the seventeenth resist R17 is formed. The resist R17 covers the sidewalls 219SW and the peripheral portions of gate oxide films 112Gn, 112Gp of the high-breakdown voltage transistors. The unnecessary portions of seventh oxide film 190 exposed to the apertures of seventeenth resist R17 are removed by etching. This results in the formation, as shown in FIG. 37, of protective film 190P which protects sidewalls 219SW and the peripheral portions of gate oxide films 112Gn, 112Gp of the high-breakdown voltage transistors.

In FIG. 36 the seventeenth resist R17 is formed so as to cover the edges on the periphery of the upper surfaces of gates 160Hn, 160Hp. Note that the aperture size made in the seventeenth resist R17 above each gate 160Hn, 160Hp is smaller than the aperture size made above each gate 160Hn, 160Hp in the two resists R15A and R16A used in FIGS. 34 and 35. This is so that the edges of protective layer 190P will retreat when the seventh oxide film 190 is etched. For the same reason, the seventeenth resist R17 is formed so that the area around gate oxide films 112Gn, 112Gp are completely covered. This use of resist R17 makes it possible to form protective film 190P to the desired dimensions. As shown in FIG. 37, in this embodiment, protective film 190P is formed so as to cover the edges on the periphery of the upper surfaces of gates 160Hp, 160Hn.

Once the protective layer 190P is formed, the processes shown in FIGS. 28 and 29 are performed, and silicide is formed over the surface of the drain and source regions of transistors. In this embodiment, as shown in FIG. 37, the circumferences of gate oxide films 112Gn, 112Gp are protected by protective film 190P. This makes it possible to prevent the formation of silicide by compounding the lower layer regions of the circumferences of the high-breakdown voltage transistor gate oxide films 112Gn, 112Gp with the titanium film 180. This in turn makes it possible to reduce the lowering of drain breakdown voltage.

In this embodiment, Step S300 (FIG. 1) for the wiring process is conducted while protective film 190P remains, but it is also possible to remove protective film 190P after the silicide formation process.

As explained above, in this embodiment it is possible to efficiently form the high-breakdown voltage transistor and the low-breakdown voltage transistor on the same substrate, as is the case in the Comparative Example. In this embodiment it is also possible to reduce the deterioration of transistor characteristics which occur for each transistor in the Comparative Example.

Figure 38:
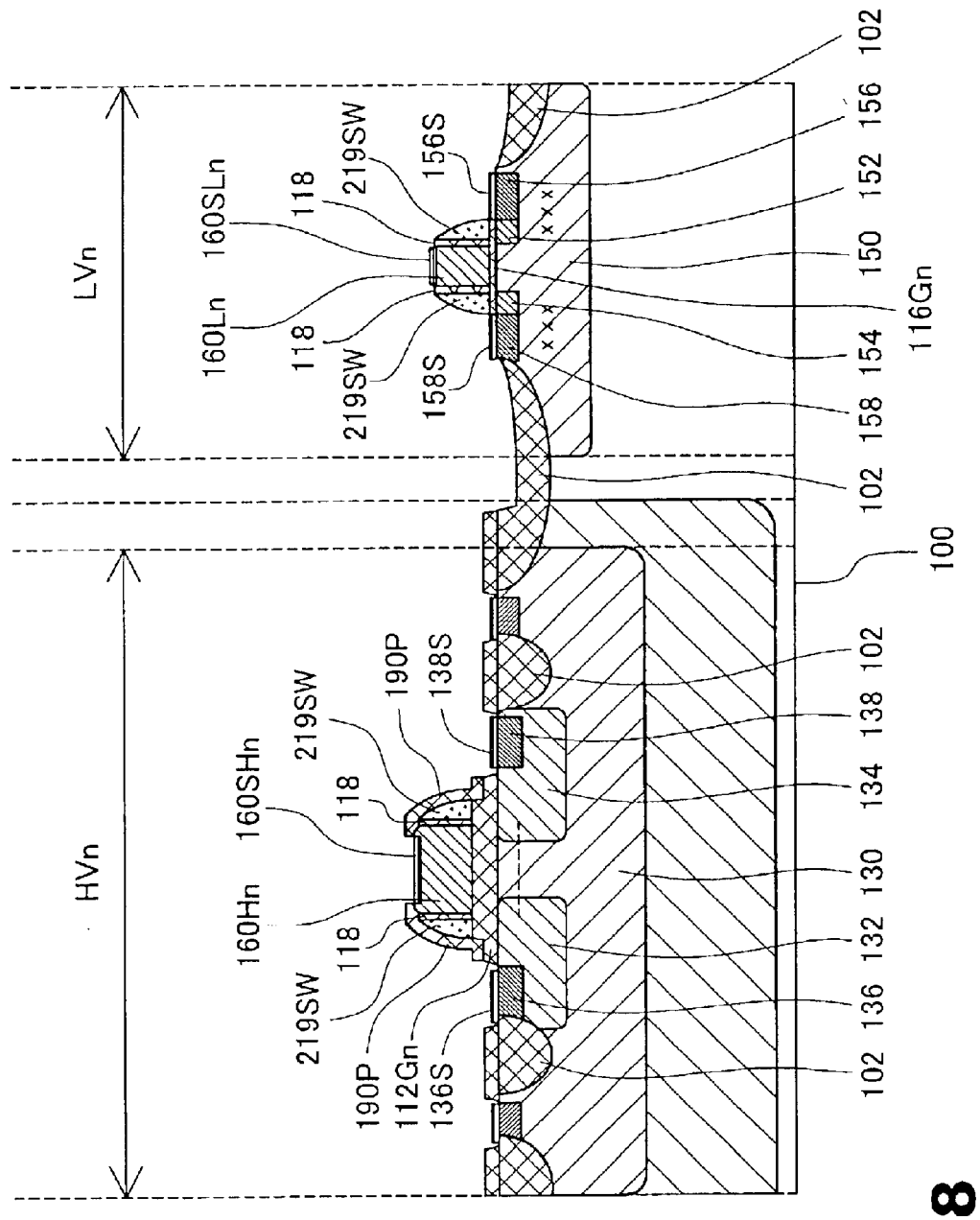
FIG. 38 is a simplified cross-section showing the structural characteristics of the high- and low-breakdown voltage transistors manufactured according to the element formation process of the First Embodiment.

FIG. 38 is a simplified cross-section showing the structural characteristics of the high- and low-breakdown voltage transistors manufactured according to the element formation process of the First Embodiment. Although FIG. 38 shows the high-breakdown voltage nMOS transistor and the low-breakdown voltage nMOS transistor, the situation will be similar for the high-breakdown voltage pMOS transistor and the low-breakdown voltage pMOS transistor.

In the low-breakdown voltage nMOS transistor, the polysilicon gate 160Ln is formed above gate oxide film 116Gn, and sidewalls 219SW composed of nitride are formed on the sides of gate 160Ln, with oxide film 118 disposed between them. The silicide 160SLn is formed on the upper surface of gate 160Ln.

In the high-breakdown voltage nMOS transistor, as is the case with the low-breakdown voltage nMOS transistor, the polysilicon gate 160Hn is formed above gate oxide film 116Gn, and sidewalls 219SW composed of nitride are formed on the sides of gate 160Hn, with oxide film 118 disposed between them. The silicide 160SHn is formed on the upper surface of polysilicon gate 160Hn. The high-breakdown voltage nMOS transistor also has a protective film 190P formed so as to cover the periphery of gate oxide film 112Gn and sidewalls 219SW. In this embodiment, protective film 190P covers the peripheral edge of the upper surface of gate 160Hn. Thus, silicide 160SHn is formed on the upper surface of gate 160Hn except for the periphery. Even when the protective film 190P is removed after the silicide formation process, silicide 160SHn is also formed on the upper surface of gate 160Hn except for the periphery.

C. Second Embodiment:

The manufacturing process of the Second Embodiment follows the flowchart of FIG. 1, as is the case for the Comparative Example. However, again the contents of Steps S209, S210, and S211 are changed.

In this embodiment, Step S209 for sidewall formation process is designed so that when the oxide film over the drain and source formation regions for each transistor is removed, the width of the sidewalls will not become too narrow, such as is shown in FIG. 30. Namely, in the Comparative Example (FIGS. 23 and 24) when the sidewalls 119SW is formed, etching is performed continuously until the relatively thick oxide film is removed from the drain and source formation regions for the high-breakdown voltage transistor, but in this embodiment this is divided into two etching processes.

Figure 39:
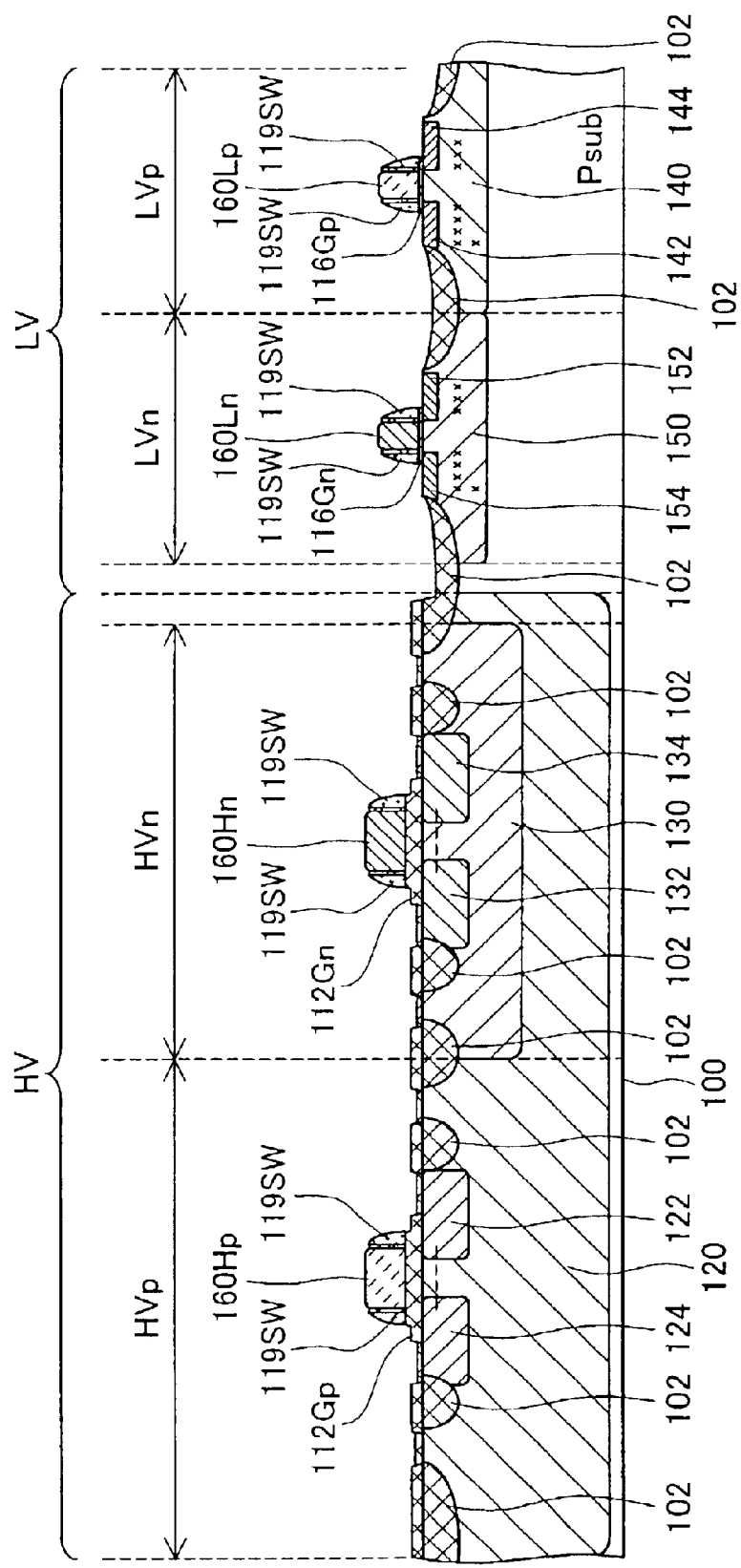
FIG. 39 is a simplified cross-section showing the situation when the first round of etching in the sidewall formation process of the Second Embodiment has been completed.

FIG. 39 is a simplified cross-section showing the situation when the first round of etching in the sidewall formation process of the Second Embodiment has been completed. As shown in the figure, the first round of etching is performed until the relatively thin oxide films 116 and 118 (FIG. 23) have been removed from the drain and source formation regions for the low-breakdown voltage transistors. At this time, as shown in FIG. 39, the relatively thick oxide film over the drain and source formation regions for the high-breakdown voltage transistors will have become thinner but have not yet been completely removed.

FIG. 40 is a simplified cross-section showing the situation when the second round of etching in the sidewall formation process of the Second Embodiment has been completed. In FIG. 40, prior to starting the second round of etching, the eighteenth resist R18 is formed in order to protect region LV. The resist R18 has an aperture over region HV, and is formed by using common resist mask, to be used for the first resist R1 (FIG. 3). Once region LV has been protected, the oxide films exposed to the aperture of eighteenth resist R18 are etched. The second round of etching is performed until the oxide film remaining over the drain and source regions of the high-breakdown voltage transistor is removed.

In this arrangement, when the aperture is made in the relatively thick oxide film remaining over the high-breakdown voltage transistor drain and source formation regions, the sidewalls 119SW formed on the sides of the low-breakdown voltage transistor gates will not be etched. This makes it possible to etch the oxide film from the drain and source formation regions for the high-breakdown voltage transistors, without diminishing the width of the sidewalls for the low-breakdown voltage transistors. It also makes it possible to maintain good precision in the interval between the drain and source regions of the low-breakdown voltage transistor, which in turn makes it possible to reduce the lowering of drain breakdown voltage.

The processes for Steps S210 and S211 of this embodiment are similar to those steps in the First Embodiment, so the detail explanation is omitted. The structural characteristics for the high- and low-breakdown voltage transistors manufactured according to the element formation process of the Second Embodiment are also similar to those of the First Embodiment (FIG. 38). However, the sidewalls are formed from oxide in the Second Embodiment.

As explained above, in this embodiment it is possible to efficiently from the high-breakdown voltage transistor and the low-breakdown voltage transistor on the same substrate, as is the case in the Comparative Example. In this embodiment it is also possible to reduce the deterioration of transistor characteristics which occur for each transistor in the Comparative Example.

The present invention is not restricted to the above embodiment or its modifications, but there may be many other modifications, changes, and alterations without departing from the scope or spirit of the main characteristics of the present invention. Some examples of possible modification are given below.

(1) In the above embodiments, as shown in FIGS. 34 and 35, resists R15A and R16A are formed so as to cover the periphery of gate oxide films 112Gn and 112Gp, the sidewalls 219SW, and the periphery of the upper surface of gates 160Hn and 160Hp of the high-breakdown voltage transistors, but generally resists are formed so as to cover at least the periphery of the gate oxide film of the high-breakdown voltage transistor.

(2) In the above embodiments, as shown in FIG. 37, protective films 190P are formed so as to cover the periphery of gate oxide films 112Gn and 112Gp, the sidewalls 219SW, and the peripheral edges of the upper surface of gates 160Hn and 160Hp of the high-breakdown voltage transistors, but generally protective films are formed so as to cover at least the periphery of the gate oxide films of the high-breakdown voltage transistor.

In the above embodiments, protective films 190P are composed of silicon oxide, but may instead be composed of silicon nitride ($Si_3N_4$), for example.

(3) In the above embodiments, the silicide on the polysilicon gate is formed by using titanium (Ti), but may instead be formed by using Mo, W, Ta, or other high-melting point metals. The use of Ti is advantageous because the heat treatment for forming the silicide can be conducted at a relatively low temperature. The use of Ti and Ta are advantageous because the resistivity of their silicides is relatively low.

(4) In the First Embodiment, sidewalls are formed of silicon nitride and selectively etched. In the Second Embodiment, etching process is performed in two separate stages. In general, when forming apertures in the relatively thick oxide film over the drain and source formation regions for the high-breakdown voltage transistor, the etching will be performed in a way that does not diminish the width of the sidewall formed on the sides of the low-breakdown voltage transistor gates.

(5) In the above embodiments, a p-type silicon substrate is used as the semiconductor substrate, but it is also possible to use n-type silicon substrate and other types of semiconductor substrates.

In the above embodiments, the gate oxide film for each transistor is formed by thermal oxidation, but may instead be formed by deposition, such as CVD. However forming the gate oxide film by thermal oxidation has the advantage of allowing good quality film to be formed with relatively high insulation property.

The above embodiments use gates in which silicide is formed over the surface of polysilicon that had been doped with impurities, but it is also possible to use gates that are formed with metallic materials alone.

The above embodiments use silicon oxide film as gate insulating film of each transistor, but it is also possible to use other insulating films such as silicon nitride film. Namely, the transistor will have a MIS structure.

As described above, in general, the present invention can be applied to the formation of high- and low-breakdown voltage transistors of insulation gate-type on the same semiconductor substrate.

(6) In the First Embodiment, sidewalls 219SW are composed of silicon nitride, but it may also be composed of other insulating materials that are different from silicon oxide films. Generally, the sidewall may be formed by using a material film composed of an insulating material that are different from the gate insulating film, the material film allowing selective etching of the insulating film and the material film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device in which a high-breakdown voltage transistor and a low-breakdown voltage transistor of insulated-gate type, having different drain-source breakdown voltages, are present on the same semiconductor substrate, each transistor being formed in one of element formation regions of the substrate, each element formation region including a source formation region and a drain formation region, the manufacturing method comprising the steps of:

(a) forming an insulating film containing portions to be used as gate insulating films within each of the element formation regions, the insulating film portions formed on the drain and source formation regions for the high-breakdown voltage transistor being thicker than those for the low-breakdown voltage transistor;

(b) forming gates on the insulating films of the transistors;

(c) forming sidewalls on the sides of the gate of at least the low-breakdown voltage transistor, and making apertures in the insulating film portions over the drain and source formation regions for the transistors by etching, wherein at least when the apertures are about to be completed in relatively thick insulating film portions on the drain and source formation regions for the high-breakdown voltage transistor, the etching is performed not to narrow widths of sidewalls formed on the sides of the gate of the low-breakdown voltage transistor; and (d) introducing impure elements into the drain and source formation regions for the transistors through the apertures made in the insulating film so as to form drain and source regions of the transistors.

2. The method for manufacturing a semiconductor device according to claim 1, wherein the step (c) includes:

(c1) forming, on the element formation region for at least the low-breakdown voltage transistor, a material film composed of insulating material different from the insulating film;

(c2) performing selective etching for etching the material film not to etch the insulating film, so as to form the sidewalls on the sides of the gate of at least the low-breakdown voltage transistor; and (c3) performing selective etching for etching the insulating film not to etch the material film, so as to make the apertures in the insulating film portions present above the drain and source formation regions for the transistors.

3. The method for manufacturing a semiconductor device according to claim 2, wherein the semiconductor substrate is a silicon substrate;

the insulating film is a silicon oxide film; and the material film is a silicon nitride film.

4. The method for manufacturing a semiconductor device according to claim 3, wherein the step (b) includes forming the gates of the transistors of polysilicon;

the step (c) includes forming a silicon oxide film on the sides of the gates formed of polysilicon prior to the formation of the sidewalls; and the step (d) includes introducing impure elements into the gates.

5. The method for manufacturing a semiconductor device according to claim 1, where in the step (c) includes:

(c1) forming, on the element formation region for at least the low-breakdown voltage transistor, a material film composed of the same material as the insulating film;

(c2) etching the material film so as to form the sidewalls on the sides of the gate of at least the low-breakdown voltage transistor; and continuing the etching so as to make the apertures on the relatively thin insulating film portions present over the drain and source formation regions for the low-breakdown voltage transistor;

(c3) forming a resist for protecting the element formation region for the low-breakdown voltage transistor; and (c4) further etching the insulating film so as to make the apertures on the relatively thick insulating film portions remaining over the drain and source formation regions for the high-breakdown voltage transistor.

6. The method for manufacturing a semiconductor device according to claim 5, wherein the semiconductor substrate is a silicon substrate; and the insulating film and the material film are silicon oxide films.

7. The method for manufacturing a semiconductor device according to claim 1, wherein the semiconductor substrate is a silicon substrate;

the insulating film is a silicon oxide film;

the step (b) includes forming the gates of the transistors of polysilicon; and the step (d) includes introducing impure elements into the gates.

8. The method for manufacturing a semiconductor device according to claim 1, wherein the step (b) includes forming the gate of the high-breakdown voltage transistor over a center portion of the gate insulating film; and the step (d) includes the steps of:

providing a resist above a peripheral portion of the gate insulating film of at least the high-breakdown voltage transistor; and introducing the impure elements into the drain and source formation regions for the transistors by ion implantation.

9. The method for manufacturing a semiconductor device according to claim 1, wherein the step (b) includes forming the gate of the high-breakdown voltage transistor over a center portion of the gate insulating film; and the method further comprises the steps of:

(e) providing a protective film above a peripheral portion of the gate insulating film of at least the high-breakdown voltage transistor; and (f) forming a metallic layer over at least the drain and source regions of the transistors, and causing the metallic layer to compound with surface layers of the drain and source regions, so as to form contact layers for connecting to metal wires.

10. The method for manufacturing a semiconductor device according to claim 9, wherein the semiconductor substrate is a silicon substrate;

the insulating film is a silicon oxide film;

the step (b) includes forming the gates of the transistors of polysilicon;

the step (d) includes introducing impure elements into the gates; and the step (f) includes forming the metallic layer over the gates of the transistors, and causing the metallic layer to compound with the surface layers of the gates, so as to form the contact layers.

11. A method for manufacturing a semiconductor device in which a high-breakdown voltage transistor and a low-breakdown voltage transistor, having different drain-source breakdown voltages, are present on the same semiconductor, comprising:

(a-1) forming a first gate insulating film in a high-breakdown voltage transistor formation region;

(a-2) forming a second gate insulating film in a low-breakdown voltage transistor formation region, the second gate insulating film being thinner than the first gate insulating film;

(b) forming gates on the first gate insulating film and the second gate insulating film;

(c-1) forming sidewalls composed of silicon nitride on the sides of the gates;

(c-2) forming apertures above a source formation region and a drain formation region for the high-breakdown voltage transistor and above a source formation region and a drain formation region for the low-breakdown voltage transistor by selectively etching; and (d) forming sources and drains for the high-breakdown voltage transistor and the low-breakdown voltage transistor.

* * * * *

UNITED STATES PATENT AND TRADEMARK OFFICE
CERTIFICATE OF CORRECTION

PATENT NO. : 6,780,701 B2
DATED : August 24, 2004
INVENTOR(S) : Atsushi Kanda et al.

Page 1 of 1

It is certified that error appears in the above-identified patent and that said Letters Patent is hereby corrected as shown below:

<u>Title page,</u>
Item [75], Inventors, should read -- Atsushi Kanda, Suwa, (JP); Yasushi Haga, Sakata (JP) --

Signed and Sealed this

Fifteenth Day of March, 2005

JON W. DUDAS
*Director of the United States Patent and Trademark Office*